(12) United States Patent
Kim et al.

(10) Patent No.: US 10,885,261 B2
(45) Date of Patent: Jan. 5, 2021

(54) SYSTEMS AND METHODS OF FABRICATING SEMICONDUCTOR DEVICES

(71) Applicant: Samsung Electronics Co., Ltd., Suwon-si (KR)

(72) Inventors: Jong-won Kim, Hwaseong-si (KR); Jae-pil Shin, Suwon-si (KR); Tae-heon Kim, Hwaseong-si (KR); Yong-hyeon Kim, Hwaseong-si (KR); Tae-hyun Kim, Seongnam-si (KR); Jin-kyu Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/670,282

(22) Filed: Oct. 31, 2019

(65) Prior Publication Data

US 2020/0065453 A1 Feb. 27, 2020

Related U.S. Application Data

(63) Continuation of application No. 15/716,856, filed on Sep. 27, 2017, now Pat. No. 10,509,885.

(30) Foreign Application Priority Data

Oct. 7, 2016 (KR) .......................... 10-2016-0129874

(51) Int. Cl.
*G06F 30/00* (2020.01)
*G06F 30/398* (2020.01)

(52) U.S. Cl.
CPC .................................. *G06F 30/398* (2020.01)

(58) Field of Classification Search
CPC ...................................................... G06F 30/398
(Continued)

(56) References Cited

U.S. PATENT DOCUMENTS 7,369,703 B2  5/2008  Yamaguchi et al.
8,041,105 B2  10/2011  Mitsui
(Continued)

FOREIGN PATENT DOCUMENTS

JP   H11-257940 A   9/1999
JP   2014-206550 A   10/2014

*Primary Examiner* — Suchin Parihar
(74) *Attorney, Agent, or Firm* — Harness, Dickey & Pierce, P.L.C.

(57) ABSTRACT

Patterns in an integrated circuit may be evaluated, and a semiconductor device may be fabricated based on the evaluation. The evaluation may include a extracting and superimposing first patterns corresponding to design patterns of the same shape from input layout data generated based on inspecting the integrated circuit, generating distribution data of the first patterns based on the superimposed first patterns, determining an evaluation contour of the design patterns based on an evaluation condition and the distribution data, and generating output layout data based on replacing the first patterns with second patterns each having the evaluation contour. Weak points in the integrated circuit may be detected based on the output layout data. The fabricating may include selectively incorporating an integrated circuit into a semiconductor device based on a determination that the integrated circuit includes less than a threshold quantity and/or threshold concentration of weak points.

17 Claims, 16 Drawing Sheets

(58) Field of Classification Search
USPC .......................................................... 716/111
See application file for complete search history.

(56) References Cited

U.S. PATENT DOCUMENTS

| | | | |
|---|---|---|---|
| 8,422,761 B2 | 4/2013 | Kitamura et al. | |
| 8,515,153 B2 | 8/2013 | Sugiyama et al. | |
| 8,942,464 B2 | 1/2015 | Shibahara et al. | |
| 9,098,649 B2 | 8/2015 | Chiang et al. | |
| 9,189,843 B2 | 11/2015 | Kitamura et al. | |
| 9,244,365 B2 | 1/2016 | Okamoto et al. | |
| 2003/0174877 A1* | 9/2003 | Aiger | G01R 31/2801 382/145 |
| 2005/0146714 A1 | 7/2005 | Kitamura et al. | |
| 2005/0238221 A1* | 10/2005 | Hirano | G06T 7/0006 382/144 |
| 2006/0245636 A1* | 11/2006 | Kitamura | G06K 9/036 382/149 |
| 2008/0130982 A1 | 6/2008 | Kitamura et al. | |
| 2009/0039263 A1* | 2/2009 | Matsuoka | G06T 7/0006 250/311 |
| 2009/0232385 A1* | 9/2009 | Matsuoka | G06T 7/001 382/145 |
| 2012/0053892 A1* | 3/2012 | Matsuoka | G03F 7/70633 702/167 |
| 2015/0012243 A1* | 1/2015 | Honda | G03F 7/70558 702/155 |
| 2016/0071261 A1 | 3/2016 | Yang et al. | |
| 2016/0300338 A1* | 10/2016 | Zafar | G06K 9/6201 |

* cited by examiner $$P_A = \int_{-\infty}^{A} f(x)dx = \frac{q_{ij}}{q_{MAX}} \quad (q_{ij} \in Q, \ q_{MAX} = \underset{q_{ij} \in Q}{MAX}(q_{ij}))$$

$$V_{eval} = P_A \cdot q_{MAX}$$

| CONTOUR | L | $-3\sigma$ | 25% | M | 75% | $3\sigma$ | S |
|---------|---|-----------|------|------|------|----------|------|
| $V_{EVAL}$ | 1 | $0.0027^{*}q_{MAX}$ | $0.25^{*}q_{MAX}$ | $0.5^{*}q_{MAX}$ | $0.75^{*}q_{MAX}$ | $0.9973^{*}q_{MAX}$ | $q_{MAX}$ |

| LINE | D1 | D2 | AVERAGE |
|---|---|---|---|
| L1 | 8 | 11 | 6.34 |
| L2 | 6 | 10 | 5.33 |
| ⋮ | | | |
| Lm | 2 | 5 | 2.33 |

SYSTEMS AND METHODS OF FABRICATING SEMICONDUCTOR DEVICES

CROSS-REFERENCE TO RELATED APPLICATION

This application is a continuation of U.S. application Ser. No. 15/716,856, filed on Sep. 27, 2017, which claims the benefit, under 35 U.S.C. § 119, of Korean Patent Application No. 10-2016-0129874, filed on Oct. 7, 2016, in the Korean Intellectual Property Office, the disclosure of each of which is incorporated herein in its entirety by reference.

BACKGROUND

The inventive concepts relate to integrated circuits, and more particularly, to methods and systems for evaluating patterns of an integrated circuit.

With the development of semiconductor process technology, integrated circuits may include more finely formed patterns and may include a greater number ("quantity") of elements, e.g., transistors. A designer of integrated circuits may make design layout data, and the integrated circuits may be manufactured by a semiconductor process using a mask manufactured based on the design layout data. Due to miniaturization of semiconductor processes and process variations, integrated circuits manufactured by semiconductor processes may have shapes that differ from design layout data.

SUMMARY

The inventive concepts provide methods of evaluating an integrated circuit, and more particularly, a method and a system for evaluating patterns of an integrated circuit manufactured by a semiconductor process.

According to some example embodiments, a computing system for evaluating patterns in an integrated circuit, may include: a memory configured to store information comprising program procedures; and a processor. The processor may be configured to access the memory and execute the program procedures to: extract and superimpose first patterns corresponding to design patterns having a substantially common shape from input layout data generated based on an inspection of the integrated circuit; generate distribution data associated with the first patterns based on the superimposed first patterns; determine an evaluation contour of the design patterns based on an evaluation condition and the distribution data; and generate output layout data based on replacing the first patterns with second patterns each having the evaluation contour.

According to some example embodiments, a method, performed by a computing system, of evaluating patterns of an integrated circuit, may include: obtaining input layout data generated based on inspecting the integrated circuit; extracting and superimposing first patterns corresponding to design patterns having a substantially common shape from the input layout data; generating distribution data of the first patterns based on superimposed first patterns; determining an evaluation contour of the design patterns based on an evaluation condition and the distribution data; generating output layout data based on replacing the first patterns with second patterns each having the evaluation contour; and generating measurement data based on measuring at least one of the second patterns from the output layout data.

According to some example embodiments, a method may include: obtaining input layout data generated based on inspecting an integrated circuit; extracting and superimposing first patterns corresponding to design patterns having a substantially common shape from the input layout data; generating distribution data of the first patterns based on superimposed first patterns; determining an evaluation contour of the design patterns based on an evaluation condition and the distribution data; generating output layout data based on replacing the first patterns with second patterns each having the evaluation contour; determining whether the inspected integrated circuit includes at least a threshold quantity and/or threshold concentration of weak points based on measuring at least one of the second patterns from the output layout data; and selectively incorporating the inspected integrated circuit into a semiconductor device based on a determination that the inspected integrated circuit includes less than the threshold quantity and/or the threshold concentration of weak points.

According to some example embodiments, a method may include: obtaining input layout data generated based on inspecting an integrated circuit; extracting and superimposing first patterns corresponding to design patterns having a substantially common shape from the input layout data; determining an evaluation contour of the design patterns based on an evaluation condition and the superimposed first patterns; determining whether the inspected integrated circuit includes at least a threshold quantity and/or threshold concentration of weak points based on replacing the first patterns with second patterns each having the evaluation contour and measuring at least one of the second patterns; and selectively incorporating the inspected integrated circuit into a semiconductor device based on a determination that the inspected integrated circuit includes less than the threshold quantity and/or the threshold concentration of weak points.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
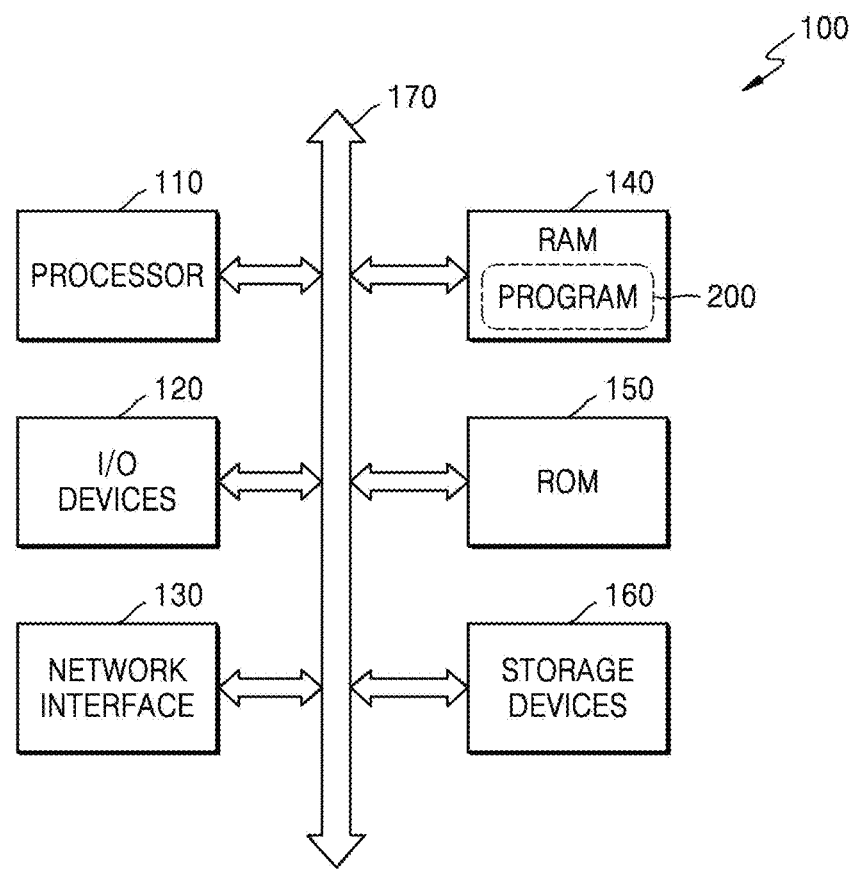
FIG. 1 is a block diagram of a computing system including a memory for storing a program of instructions, according to some example embodiments.

FIG. 1 is a block diagram of a computing system 100 including a memory for storing a program of instructions, according to some example embodiments. The computing system 100 may be a fixed computing system, such as a desktop computer, a workstation, or a server, or may be a portable computing system, such as a laptop computer. As shown in FIG. 1, the computing system 100 may include a processor 110 (e.g., a central processing unit (CPU), application-specific integrated circuit (ASIC), etc.), input/output devices 120, a network interface 130, random access memory (RAM) 140, read only memory (ROM) 150, and a storage device 160. The processor 110, the input/output devices 120, the network interface 130, the RAM 140, the ROM 150 and the storage device 160 may be connected to a bus 170 and may communicate with each other via the bus 170.

The processor 110 may be referred to as a processing unit and may include a core that may execute any instruction set (e.g., Intel Architecture-32 (IA-32), 64-bit extension IA-32, x86-64, PowerPC, Sparc, MIPS, ARM, IA-64, etc.), such as a microprocessor, an application processor (AP), a digital signal processor (DSP), or a graphics processing unit (GPU). For example, the processor 110 may access a memory, i.e., the RAM 140 and/or the ROM 150, via the bus 170 and may execute instructions (e.g., a program of instructions) stored in the memory (e.g., RAM 140 and/or the ROM 150). As shown in FIG. 1, the RAM 140 may store a program 200 according to some example embodiments or at least a part of the program 200, and the program 200 may make the processor 110 perform an operation of evaluating patterns of an integrated circuit. The program 200 may include a plurality of instructions executable by the processor 110, and a plurality of instructions included in the program 200 may make the processor 110 perform operations of evaluating patterns of an integrated circuit according to exemplary embodiments.

The storage device 160 may not lose stored data even if power supplied to the computing system 100 is shut off. For example, the storage device 160 may include a non-volatile memory, such as electrically erasable programmable read-only memory (EEPROM), a flash memory, phase change random access memory (PRAM), resistance random access memory (RRAM), nano floating gate memory (NFGM), polymer random access memory (PoRAM), magnetic random access memory (MRAM), or ferroelectric random access memory (FRAM), and may include a storage medium, such as magnetic tape, an optical disk, or a magnetic disk. In addition, the storage device 160 may be removable from the computing system 100. The storage device 160 may store the program 200 according to the exemplary embodiment, and the program 200 or at least a part of the program 200 may be loaded from the storage device 160 to the RAM 140 before the program 200 is executed by the processor 110. Alternatively, the storage device 160 may store a file written in a programming language, and a program 200 or at least a part of the program 200 generated by a compiler from a file may be loaded into the RAM 140.

The storage device 160 may store data to be processed by the processor 110 or data processed by the processor 110. That is, the processor 110 may generate data by processing data stored in the storage device 160, depending on the program 200, and may store the generated data in the storage device 160. For example, the storage device 160 may store input layout data D100 and an evaluation condition D200 of FIG. 3, which are processed by the program 200, and may also store distribution data D110, output layout data D310, and measurement data D320 of FIG. 3, which are generated by the program 200.

The input/output devices 120 may include an input device such as a keyboard or a pointing device, and may include an output device such as a display device or a printer. For example, a user may trigger, based on using the processor 110, the execution of the program 200 through the input/output devices 120, may input the evaluation condition D200 of FIG. 3, and may also check the distribution data D110, the output layout data D310 and/or the measurement data D320 of FIG. 3.

The input/output devices 120 may include one or more communication interfaces via which the computing system 100 may control one or more fabrication devices to control and/or implement at least a portion of a fabrication of an integrated circuit according to one or more semiconductor processes. For example, the processor 110 may execute program 200 to at least partially fabricate and/or modify an integrated circuit. In addition, the processor 110 may execute program 200 to at least partially fabricate an integrated circuit based on inspection of the integrated circuit according to some example embodiments.

The input/output devices 120 may include one or more communication interfaces via which the computing system 100 may control one or more fabrication devices to control and/or implement at least a portion of a fabrication of an electronic device according to one or more fabrication processes. For example, the processor 110 may execute program 200 to at least partially fabricate and/or modify an electronic device that includes an integrated circuit. In addition, the processor 110 may execute program 200 to at least partially fabricate an electronic device that includes an integrated circuit based on inspection of the integrated circuit according to some example embodiments.

The network interface 130 may provide access to a network external to the computing system 100. For example, the network may include a plurality of interconnected computing systems and communication links, and the communication links may include wired links, optical links, wireless links, or any other type of links.

Figure 2:
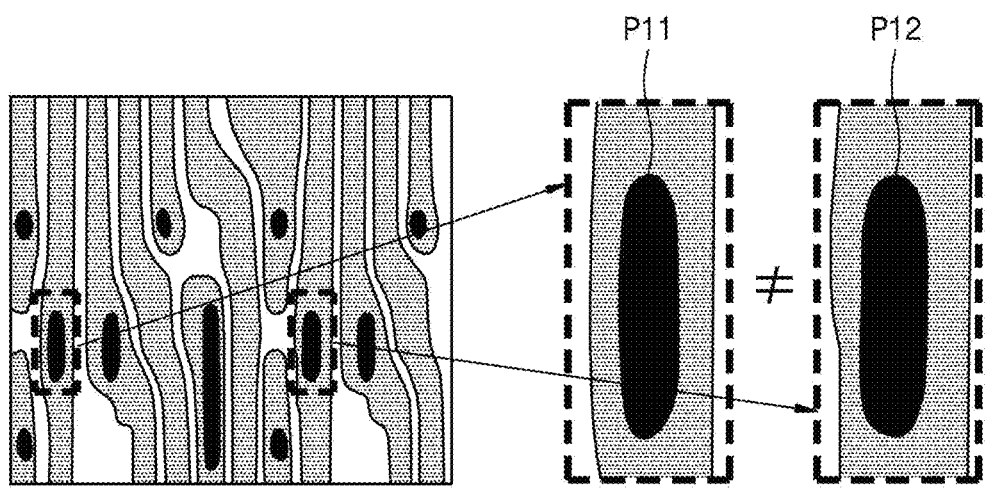
FIG. 2 is a diagram illustrating a portion of the structure of an integrated circuit generated by inspecting the integrated circuit, according to some example embodiments.

FIG. 2 is a diagram illustrating a portion of the structure of an integrated circuit generated by inspecting the integrated circuit, according to some example embodiments.

Referring to FIG. 2, the integrated circuit may include a plurality of patterns. A wafer including monocrystalline silicon or the like may be microfabricated by a semiconductor process including a plurality of sub-processes such as doping, etching, deposition, implantation, heat treatment, and patterning, and an integrated circuit may be formed in the microfabricated wafer. The microfabricated wafer may include a plurality of dies, and the integrated circuit may be formed identically for each die. A die separated from the microfabricated wafer may be manufactured as a semiconductor device, an electronic device that includes a semiconductor device, some combination thereof, or the like by a subsequent process such as packaging.

A designer of the integrated circuit may design the integrated circuit to be configured to perform a desired function by generating design layout data associated with the integrated circuit structure and further associated with the desired function and further fabricating an integrated circuit having a structure corresponding to the design layout data. As a non-limiting example, design layout data having a GDSII format may define the layout of the integrated circuit, and sub-processes of a semiconductor process may be configured based on the design layout data. For example, a sub-process for depositing a material forming a pattern of the integrated circuit may be provided, and a mask for forming a pattern included in the integrated circuit may be fabricated based on the design layout data. Due to various factors such as the miniaturization of the semiconductor process and process variations, a structure represented by the design layout data and the structure of an integrated circuit formed on a microfabricated wafer may be different from each other. For example, as shown in FIG. 2, two patterns P11 and P12, respectively corresponding to design patterns having the same shape, also referred to as design patterns having a common or substantially common shape (e.g., a common shape within manufacturing tolerances and/or material tolerances), in design layout data, may have different shapes. Such a variation in shapes may result in at least one integrated circuit having a weak point, which may further result in reduced performance, reliability, etc. of the integrated circuit. As a result, the lifetime of the integrated circuit may be shortened based on the variation in shapes.

A designer of the integrated circuit may recognize a weak point of the integrated circuit by evaluating the integrated circuit formed on a microfabricated wafer. For example, an image of a microfabricated wafer photographed using a scanning electron microscope (SEM) or the like may be used to detect a weak point of an integrated circuit. The weak point of an integrated circuit may refer to a structure included in the integrated circuit, which may cause malfunction, failure, and weak durability of the integrated circuit. For example, the weak point of an integrated circuit may include thin patterns, adjacent patterns, edges of elongated lines, and the like. A designer of the integrated circuit may modify design layout data or reconfigure semiconductor processes to reduce weak points.

A system and a method of evaluating patterns of an integrated circuit and fabricating integrated circuits according to some example embodiments, which are described below, may include automatically evaluating patterns of an integrated circuit with high coverage for a short time. In addition, the system and the method may include evaluating an integrated circuit with high accuracy by using the distribution of a plurality of patterns. One or more integrated circuits may be selectively included in a fabricated semiconductor device, based on the evaluation. Accordingly, the time-to-market of a semiconductor device including an integrated circuit may be effectively shortened.

Figure 3:
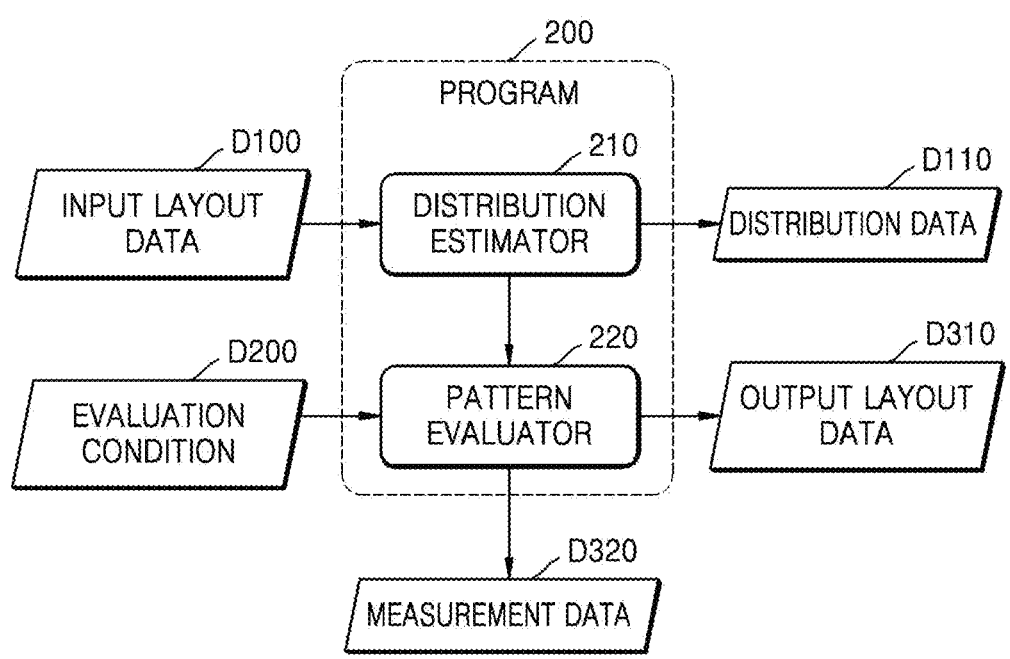
FIG. 3 is a block diagram of the program of FIG. 1 according to some example embodiments.

FIG. 3 is a block diagram of the program 200 of FIG. 1 according to some example embodiments. As described above with reference to FIG. 1, the program 200 may include a plurality of instructions, and the plurality of instructions included in the program 200, when executed by the processor 110, may make the processor 110 perform an operation of evaluating patterns of an integrated circuit and/or incorporating the integrated circuit into the fabrication of a semiconductor device according to some example embodiments. FIG. 3 shows a schematic block diagram of the program 200 and input/output data, i.e., the input layout data D100, the distribution data D110, the evaluation condition D200, the output layout data D310, and the measurement data D320.

Referring to FIG. 3, the program 200 may include a plurality of procedures i.e., a distribution estimator 210 and a pattern evaluator 220. The procedure may refer to a series of instructions for performing a particular task. The procedure may also be referred to as a function, a routine, a subroutine, a subprogram, or the like. Each of the procedures, when executed by the processor 110, may cause the processor 110 to process input data (e.g., the input layout data D100 and the evaluation condition D200) or output data (e.g., the distribution data D110) of another procedure. Herein, that the processor 110 of FIG. 1 performs an operation by executing a procedure (e.g., the distribution estimator 210 or the pattern evaluator 220) is also understood as that the procedure (e.g., the distribution estimator 210 or the pattern evaluator 220) performs the operation.

The distribution estimator 210 may estimate the distribution of first patterns corresponding to design patterns having the same shape from the input layout data D100. For example, the distribution estimator 210 may estimate the distribution of first patterns based on extracting and superimposing the first patterns corresponding to design patterns having the same shape from the input layout data D100. The input layout data D100 may be generated based on inspecting an integrated circuit formed in a microfabricated wafer and may represent the structure of an integrated circuit formed by a semiconductor process. For example, the input layout data D100 may be generated from an image generated by inspecting an integrated circuit by using an SEM. As referred to herein, data generated based on inspection of an integrated circuit may include sensor data (e.g., an image) generated by a sensor based on the sensor monitoring the integrated circuit (e.g., an image sensor generates image data as input layout data D100 based on scanning the integrated circuit, an SEM generates SEM data as input layout data D100 based on scanning the integrated circuit, etc.). The input layout data D100 may include data having a GDSII format as a non-limiting example and may represent the structure of patterns exposed on a microfabricated wafer, i.e., patterns included in an integrated circuit.

The design pattern may refer to a pattern associated with an integrated circuit and defined by a designer and included in design layout data of an integrated circuit. An integrated circuit formed on one die may be designed ("configured") to include a plurality of patterns having the same shape, also referred to as patterns having a common or substantially common shape (e.g., a common shape within manufacturing tolerances and/or material tolerances), and a microfabricated wafer includes a plurality of dies having the same structure, and thus, the microfabricated wafer including the plurality of dies may include a plurality of first patterns corresponding to design patterns having the same shape. For example, as shown in FIG. 2, design patterns having the same shape in design layout data may be formed in an integrated circuit as first patterns (e.g., the patterns P11 and P12 in FIG. 2) having different shapes due to process difficulty and process variation (e.g., based on limitations in manufacturing tolerances and/or material tolerances). As described later with reference to FIG. 4, the input layout data D100 generated by inspecting an integrated circuit may include information regarding the shapes of the first patterns.

Figure 6:
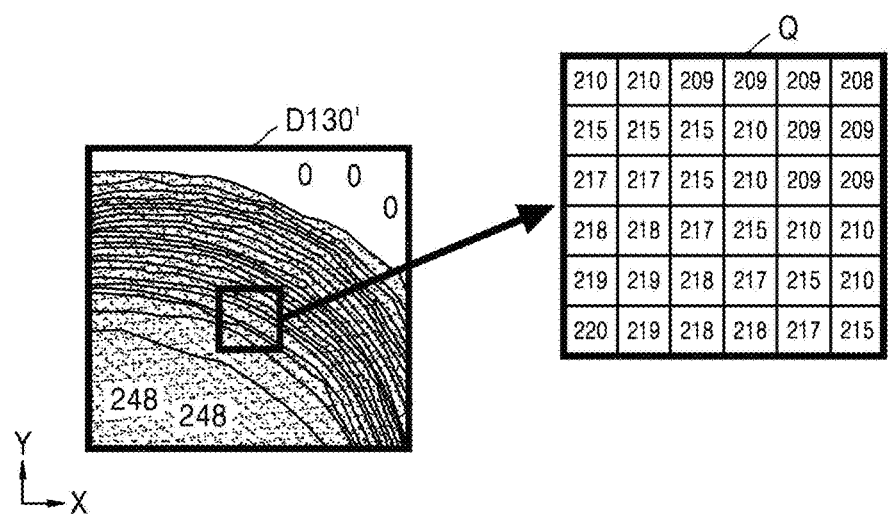
FIG. 6 illustrates an operation in which the distribution estimator of FIG. 3 generates a pixel matrix as distribution data from a superimposed image, according to some example embodiments.
Figures 10A, 10B:
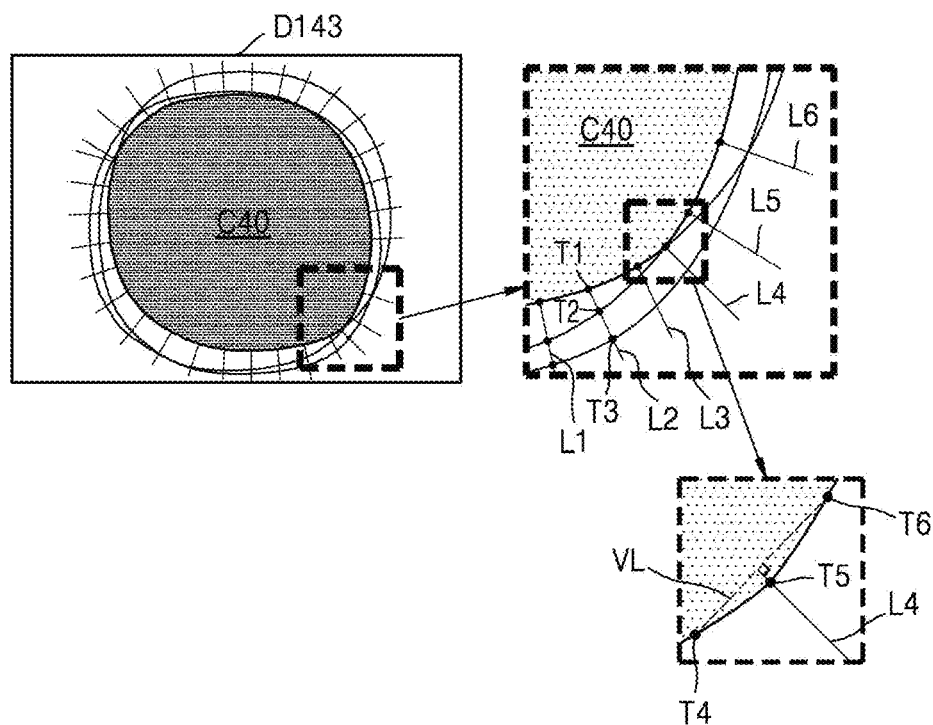
FIG. 10A and FIG. 10B illustrate operations in which the distribution estimator of FIG. 3 generates a distance table as distribution data from an overlap contour, according to some example embodiments.

The distribution estimator 210 may generate distribution data D110 of (e.g., "associated with") the first patterns. The distribution data D110 of the first patterns may be used to analyze the first patterns having different shapes corresponding to design patterns having the same shape, also referred to as design patterns having a common or substantially common shape (e.g., a common shape within manufacturing tolerances and/or material tolerances), and may be used to accurately detect a weak point of an integrated circuit. For example, the distribution data D110 of the first patterns may include a matrix, as shown in FIG. 6, and/or may have ("include") a table, as shown in FIG. 10B.

The pattern evaluator 220 may generate data for evaluating the first patterns based on the distribution data D110 and the evaluation condition D200 of the first patterns. For example, the pattern evaluator 220 may generate the output layout data D310 and the measurement data D320, as shown in FIG. 3, and may generate only one selected from the output layout data D310 and the measurement data D320.

The pattern evaluator 220 may determine an evaluation contour of design patterns corresponding to the first patterns, based on the distribution data D110 and the evaluation condition D200 of the first patterns generated by the distribution estimator 210. The evaluation condition D200 may include information defining conditions for evaluating an integrated circuit, and may include information indicating, for example, a worst case evaluation, an average evaluation, a 3σ evaluation, and the like. A user or the designer of the integrated circuit may accurately evaluate the integrated circuit by utilizing various conditions for evaluating the integrated circuit. For example, when the first patterns are evaluated to be good (e.g., matching within a particular threshold margin) under an evaluation condition D200 indicating the average evaluation or the 3σ evaluation, whereas the first patterns are evaluated to be weak (e.g., not matching within a particular threshold margin) under an evaluation condition D200 indicating the worst case evaluation, the position of a first pattern representing the worst case may be tracked and the designer of the integrated circuit may modify a design pattern corresponding to the tracked first pattern or restructure a semiconductor fabrication process. Thus, various evaluation conditions may be supported by the distribution data D110 of the first patterns, and thus, the integrated circuit may be accurately evaluated. Furthermore, based on modifying a design pattern and/or restructuring a semiconductor fabrication process based on the evaluation, the fabrication of semiconductor devices including integrated circuits may be improved, as the integrated circuits included in the semiconductor devices may have fewer weak points. As a result, the performance and/or lifetimes of the semiconductor devices may be improved based on the reduced weak points in integrated circuits fabricated based on the evaluation.

In addition, based on evaluating an integrated circuit and fabricating a semiconductor device according to at least one of the evaluation operations described herein, an efficiency and/or reliability of the fabrication of semiconductor devices including one or more integrated circuits may be improved, and further an efficiency and/or reliability of the fabrication of electronic devices including one or more semiconductor devices may be improved, thereby reducing costs associated with semiconductor device and/or electronic device fabrication.

The pattern evaluator 220 may generate output layout data D310 including second patterns having an evaluation contour. For example, the pattern evaluator 220 may generate the output layout data D310 by replacing information regarding the first patterns in the input layout data D100 with information regarding the second patterns having the same evaluation contour. The output layout data D310 may include data having a GDSII format as a non-limiting example and may include information regarding second patterns having a shape (i.e., an evaluation contour) determined according to the distribution and evaluation condition of the first patterns.

The pattern evaluator 220 may generate the measurement data D320 based on measuring the second patterns in the output layout data D310. For example, the measurement data D320 may be generated by measuring the widths, lengths, and areas of the second patterns. Further, the measurement data D320 may be generated based on measuring a distance between a second pattern and another pattern adjacent to the second pattern. Another pattern adjacent to the second pattern may be a pattern formed in the same layer as the layer of the second pattern or a pattern formed on a layer different from the layer of the second pattern. Based on the information included in the measurement data D320, a weak point of an integrated circuit may be detected. For example, the width, length, and area of a second pattern or a distance between the second pattern and another pattern may be compared with a plurality of reference values, and in response to a determination that the second pattern has a characteristic that is less than a reference value, the second pattern may be classified as a weak point of an integrated circuit.

Figure 4:
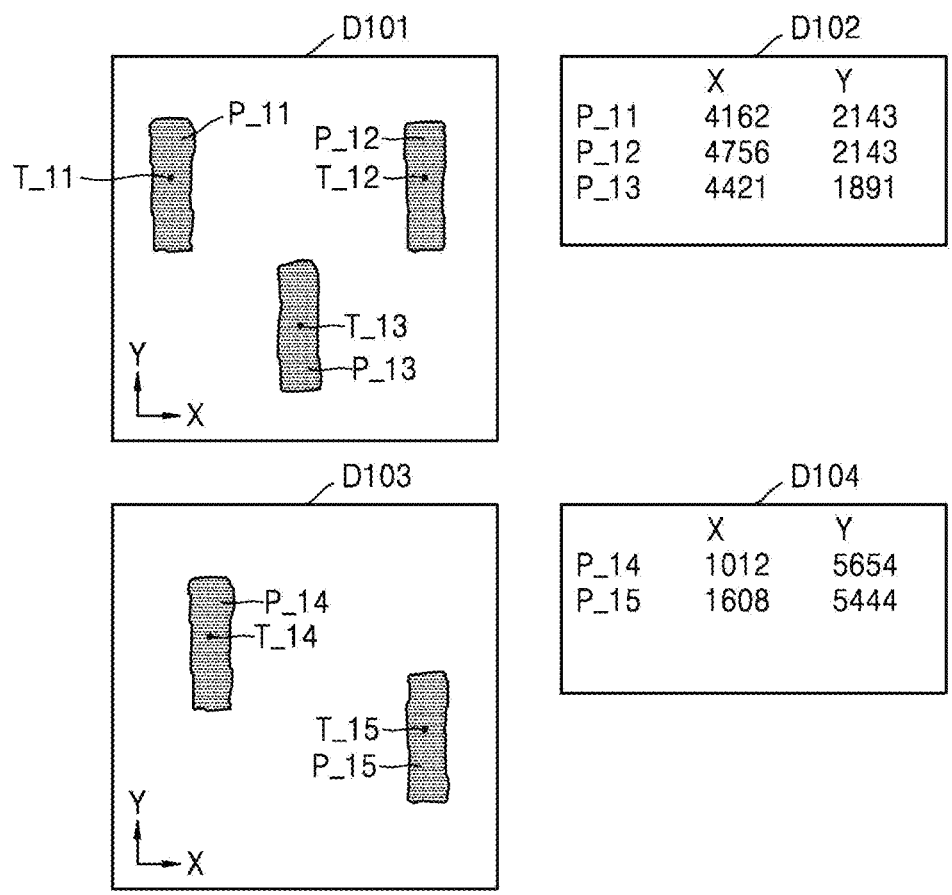
FIG. 4 is a diagram illustrating an example of input layout data of FIG. 3, according to some example embodiments.

FIG. 4 is a diagram illustrating an example of the input layout data D100 of FIG. 3, according to some example embodiments. As described above with reference to FIG. 3, the input layout data D100 of FIG. 3 may represent the structure of an integrated circuit formed in a microfabricated wafer.

In some example embodiments, the input layout data D100 may include data (e.g., data D101 and D103 in FIG. 4) representing the shape of first patterns and data (or coordinate data) (e.g., data D102 and D104 in FIG. 4) indicating the coordinates of the first patterns. In another embodiment, the input layout data D100 of FIG. 1 may be data (e.g., the data D101 and D103 in FIG. 4) representing the shape of the first patterns, and data (or coordinate data) (e.g., the data D102 and D104 in FIG. 4) representing the coordinates of the first patterns may be provided separately. Hereinafter, although the input layout data D100 of FIG. 3 includes data (e.g., the data D101 and D103 in FIG. 4) representing the shape of the first patterns and coordinate data (e.g., the data D102 and D104 in FIG. 4) indicating the coordinates of the first patterns, it will be understood that the inventive concepts are not limited thereto.

The input layout data D100 of FIG. 3 may include one or more independent data units. That is, the input layout data D100 may be data representing the whole integrated circuit continuously or may include data units generated by inspecting portions of the integrated circuit. For example, as shown in FIG. 4, first input layout data generated by inspecting a portion of the integrated circuit may include data D101 representing the shape of first patterns P_11 to P_13 and data D102 indicating the coordinates of the first patterns P_11 to P_13, and second input layout data generated by inspecting another portion of the integrated circuit may include data D103 representing the shape of first patterns P_14 and P_15 and data D104 indicating the coordinates of the first patterns P_14 and P_15.

The coordinates of the first patterns included in the data D102 and D104 may be the coordinates of points indicating the positions of the first patterns. For example, as shown in FIG. 4, the coordinates included in the data D102 and D104 may be the coordinates of points T_11 to T_15 indicating the positions of the first patterns P_11 to P_15. In some example embodiments, the coordinates of the first patterns P_11 to P_15 (i.e., the coordinates of the points T_11 to T_15) may be generated by estimating the positions of the first patterns of the input layout data D100 based on design layout data of an integrated circuit. In another embodiment, the coordinates of the first patterns P_11 to P_15 may be estimated from the shape of each of the first patterns P_11 to P_15. As described later with reference to FIGS. 5 and 9, the shape of the first patterns and the coordinates of the first patterns may be used to extract the first patterns and superpose the first patterns. The first input layout data may be provided from a wafer inspection apparatus.

Figure 5:
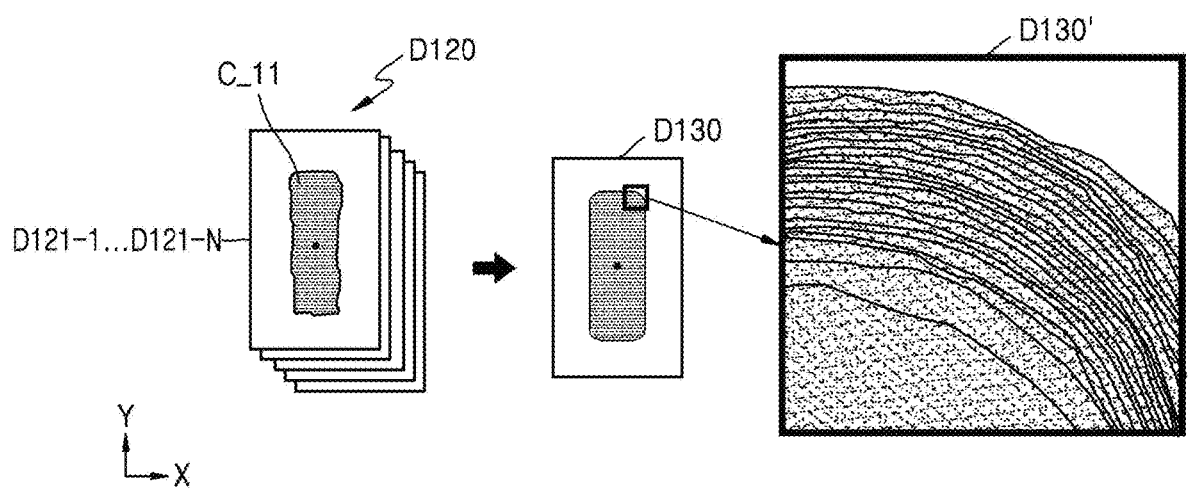
FIG. 5 illustrates an operation in which a distribution estimator of FIG. 3 superimposes first patterns, according to some example embodiments.
Figure 7:
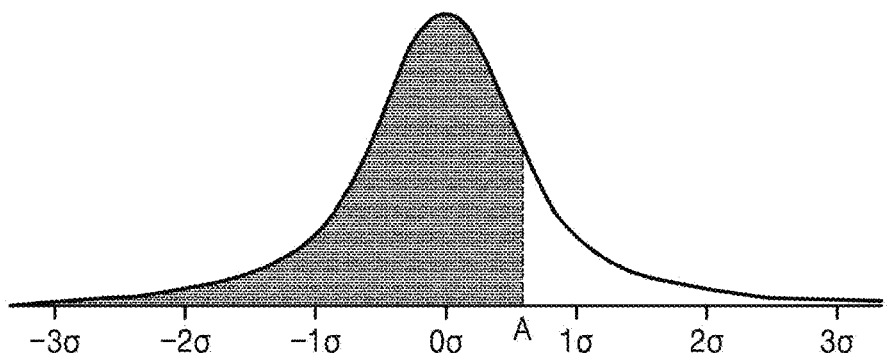
FIG. 7 illustrates an operation in which a pattern evaluator of FIG. 3 calculates an evaluation value from the distribution of first pixels estimated according to a pixel matrix, according to some example embodiments.
Figure 8:
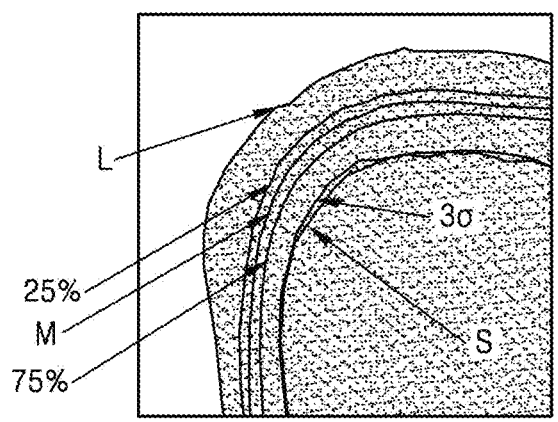
FIG. 8 illustrates an operation in which the pattern evaluator of FIG. 3 determines an evaluation contour depending on an evaluation condition, according to some example embodiments.

FIGS. 5 to 8 are diagrams illustrating operations of the distribution estimator 210 and the pattern evaluator 220 of FIG. 3, according to exemplary embodiments. Specifically, FIGS. 5 and 6 illustrate operations that are performed by the distribution estimator 210 of FIG. 3, according to some example embodiments, and FIGS. 7 and 8 illustrate operations that are performed by the pattern evaluator 220 of FIG. 3, according to some example embodiments. In the example embodiments shown in FIGS. 5 to 8, first patterns of an integrated circuit may be evaluated using an image (or image data) composed of a plurality of pixels. Hereinafter, with reference to FIGS. 5 to 8, operations, which are performed by the distribution estimator 210 and the pattern evaluator 220 of FIG. 3, for evaluating the first patterns by using an image will be described in detail.

FIG. 5 illustrates an operation in which the distribution estimator 210 superimposes the first patterns, and FIG. 6 illustrates an operation in which the distribution estimator 210 generates a pixel matrix as distribution data D110 from a superimposed image.

Referring to FIG. 5, the distribution estimator 210 may generate a set D120 of contour images D121-1 to D121-N (N being a positive integer), each contour image D121-1 to D121-N representing the contours of the first patterns, based on the coordinates of the first patterns, and may superimpose the generated contour images D121-1 to D121-N. The contour of the first pattern may refer to an area including the rim of the first pattern and the inside of the rim. For example, as shown in FIG. 5, the distribution estimator 210 may generate a first contour image D121-1 so that the contour C_11 of the first pattern P_11 of FIG. 4 is at a constant position in the first contour image D121-1. The distribution estimator 210 may generate contour images D121-1 to D121-N corresponding to the first patterns so that the contour of a first pattern is at a constant position in each of the contour images D121-1 to D121-N. That is, the contour images D121-1 to D121-N of the first patterns P_11 to P_15 may be generated so that the points T_11 to T_15 in FIG. 4 are at a constant position in each of the contour images D121-1 to D121-N. Next, as shown in FIG. 5, the distribution estimator 210 may generate a superimposed image D130 by superimposing the contour images D121-1 to D121-N. As shown in FIG. 5, the superimposed image D130 may represent a shape in which a plurality of contours corresponding to the first patterns are superimposed.

Referring to FIG. 6, the distribution estimator 210 may generate a pixel matrix from a superimposed image (e.g., the superimposed image D130 in FIG. 5). The pixel matrix may include elements corresponding to pixels of the superimposed image, and each of the elements may have as a value the quantity of superimposed contours in a pixel corresponding to the element. For example, as shown in FIG. 6, a pixel matrix Q 'corresponding to a portion D130' of the superimposed image may have as an element the quantity of superimposed contours at each position. As shown in FIG. 6, an element corresponding to a pixel close to the center of the superimposed contour may have a higher value in the pixel matrix than an element corresponding to a pixel distant from the center of the superimposed contour.

FIG. 7 illustrates an operation in which the pattern evaluator 220 calculates an evaluation value $V_{EVAL}$ from the distribution of first pixels estimated according to a pixel matrix, and FIG. 8 illustrates an operation in which the pattern evaluator 220 determines an evaluation contour depending on an evaluation condition.

Referring to FIG. 7, according to some example embodiments, the pattern evaluator 220 may consider the first patterns to have a normal distribution, based on a pixel matrix generated by the distribution estimator 210 as distribution data D110 of first patterns. That is, the pattern evaluator 220 may regard the ratio of a maximum value of elements of a pixel matrix coinciding with the total quantity of superimposed contours to the quantity of superimposed contours in a corresponding pixel as the probability density for the distribution of the first patterns. That is, as shown in FIG. 7, when a pixel matrix Q generated by the distribution estimator 210 includes a plurality of elements respectively corresponding to a plurality of pixels, the probability density function is 'f(x)', and a maximum value of the elements included in the pixel matrix Q is '$q_{MAX}$', the probability density $P_A$ corresponding to an element $q_{ij}$ may be represented as Equation 1.

$$P_A = \int_{-\infty}^{A} f(x)dx = \frac{q_0}{q_{MAX}} \left( q_{ij} \in Q, q_{MAX} = \underset{q_{ij} \in Q}{\text{MAX}}(q_{ij}) \right) \quad \text{[Equation 1]}$$

Accordingly, as described later with reference to FIG. 8, the evaluation value $V_{EVAL}$ that is used to determine an evaluation contour may be represented by Equation 2, and the evaluation value $V_{EVAL}$ may denote a minimum value (or a lower limit) which an element of the pixel matrix Q may have in selected probability density.

$$v_{EVAL} = P_A \cdot q_{MAX} \quad \text{[Equation 2]}$$

The pattern evaluator 220 may calculate the evaluation value $V_{EVAL}$ based on an evaluation condition D200. As described above with reference to FIG. 3, the evaluation condition D200 may include information defining a condition for evaluating an integrated circuit, and the probability density $P_A$ of FIG. 7 may be determined according to the information included in the evaluation condition D200. For example, if the evaluation condition D200 includes information indicating a 3σ evaluation, as shown in FIG. 8, the pattern evaluator 220 calculates the evaluation value $V_{EVAL}$ by multiplying 0.9973, which is the value of the probability density $P_A$ corresponding to 3σ of a normal distribution, by the maximum value $q_{MAX}$ of the pixel matrix Q. Similarly, when the evaluation condition D200 of FIG. 3 includes information indicating a worst case evaluation, the pattern evaluator 220 may determine the probability density $P_A$ as the inverse of the maximum value $q_{MAX}$ of the pixel matrix Q to determine an evaluation contour having a maximum size (or may set the evaluation value $V_{EVAL}$ to 1).

The pattern evaluator 220 may determine a set of pixels, corresponding to elements having a value equal to or greater than the evaluation value $V_{EVAL}$ in a pixel matrix, as an evaluation contour. For example, FIG. 8 shows edges L, −3σ, 25%, M, 75%, 3σ, and S of seven exemplary evaluation contours respectively corresponding to seven evaluation values $V_{EVAL}$. As shown in FIG. 8, the evaluation contours may be determined differently according to the evaluation condition D200, and thus, the first patterns of the integrated circuit may be accurately evaluated.

Figure 9:
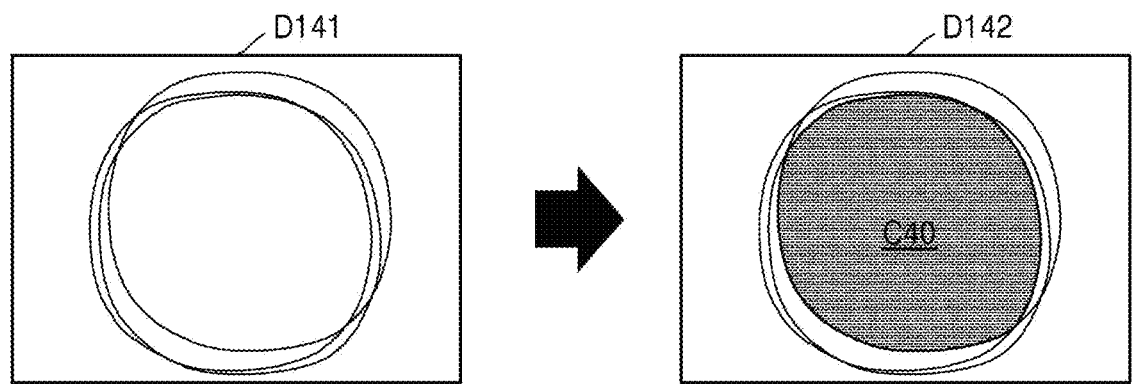
FIG. 9 illustrates an operation in which the distribution estimator of FIG. 3 generates an overlap contour by superimposing first patterns, according to some example embodiments.
Figure 11:
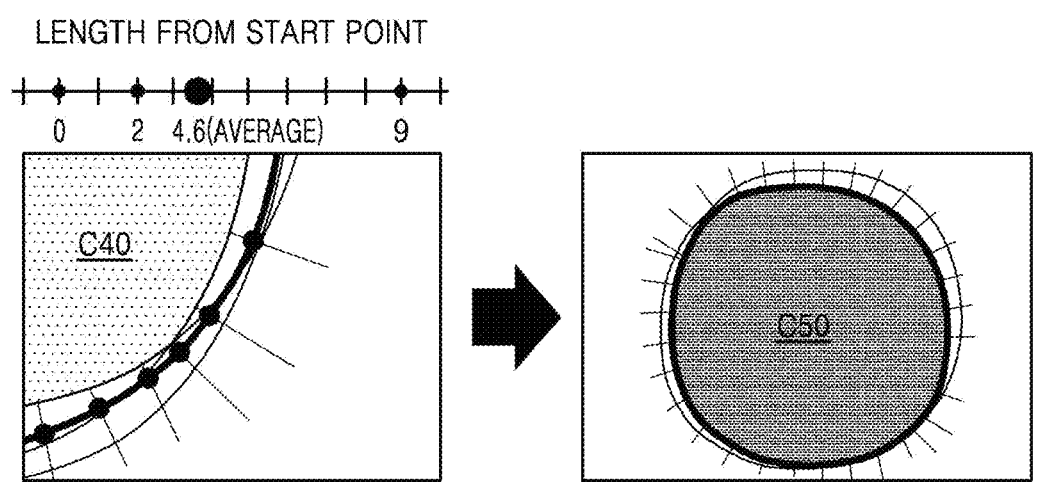
FIG. 11 illustrates an operation in which the pattern evaluator of FIG. 3 determines an evaluation contour, according to some example embodiments.
Figure 12A:
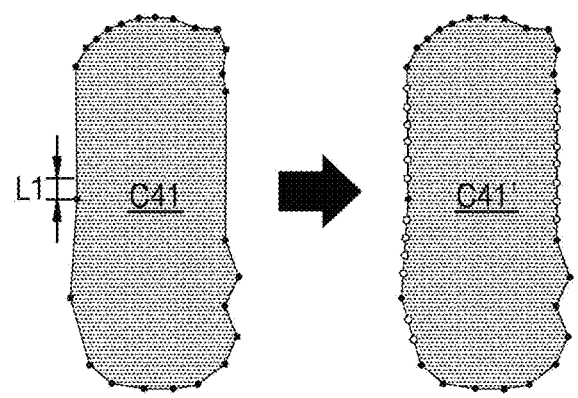
FIG. 12A and FIG. 12B illustrate operations in which the pattern evaluator of FIG. 3 extracts starting points at the edge of an overlap contour, according to some example embodiments.
Figure 12B:
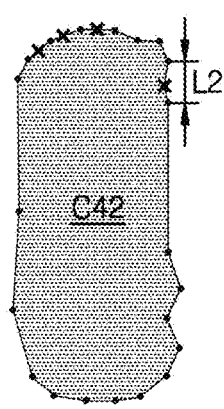

FIGS. 9 to 12B are diagrams illustrating operations that are performed by the distribution estimator 210 and the pattern evaluator 220 of FIG. 3, according to some example embodiments. Specifically, FIGS. 9 to 10B illustrate operations that are performed by the distribution estimator 210 of FIG. 3, according to some example embodiments, and FIGS. 11 to 12B illustrate operations that are performed by the pattern evaluator 220 of FIG. 3, according to some example embodiments. In the embodiments shown in FIGS. 9 to 12B, first patterns of an integrated circuit may be evaluated using an overlap contour representing an area (e.g., a "region") where the first patterns are all superimposed. Hereinafter, with reference to FIGS. 3 and 9 to 12B, operations that are performed by the distribution estimator 210 and the pattern evaluator 220 to evaluate the first patterns by using the overlap contour will be described in detail below.

FIG. 9 illustrates an operation in which the distribution estimator 210 generates an overlap contour by superimposing the first patterns, and FIGS. 10A and 10B illustrate operations in which the distribution estimator 210 generates a distance table as distribution data D110 from the overlap contour. Although FIGS. 9 to 10B illustrate an example in which three first patterns are superimposed, it will be understood that the inventive concepts is not limited thereto.

Referring to FIG. 9, according to some example embodiments, the distribution estimator 210 may superimpose first patterns of the input layout data D100, and may extract an overlap contour corresponding to an area where the first patterns are all superimposed. For example, as shown in FIG. 9, the distribution estimator 210 may generate data D141 including the superimposed first patterns, and may generate data D142 including an overlap contour C40 by extracting the overlap contour C40, which is an area where the first patterns are all superimposed, from the data D141.

Referring to FIG. 10A, according to some example embodiments, the distribution estimator 210 may extract a plurality of starting points (e.g., starting points T1, T4, and T6) on the edge of the overlap contour C40. For example, in the input layout data (D100), the first patterns may be represented as polygons, respectively, and the distribution estimator 210 may extract a plurality of inflection points on the edge of the overlap contour C40 as a plurality of starting points.

The distribution estimator 210 may generate a plurality of lines (e.g., lines L1 to L6) starting from the plurality of starting points. For example, as shown in FIG. 10A, the line L4 starting from a starting point T5 may be generated to be perpendicular to an imaginary line VL connecting the starting points T4 and T6 adjacent to the starting point T5.

The distribution estimator 210 may calculate the coordinates of intersections where a plurality of lines intersect the edges of the first patterns. For example, as shown in FIG. 10A, the distribution estimator 210 may calculate the coordinates of intersections T2 and T3 where the line L2 intersects the edges of the first patterns. Consequently, in the example of FIG. 10A, the distribution estimator 210 may calculate the coordinates of intersections T1, T2, and T3 where one line L2 intersects three patterns. Accordingly, the distribution estimator 210 may generate data D143 that includes an overlap contour C40, a plurality of lines (e.g., the lines L1 to L6), and a plurality of points (e.g., the points T1 to T6).

Referring to FIG. 10B, the distribution estimator 210 may generate a distance table TB, which includes, as items, distances from the edge of the overlap contour C40 to the intersections on a line starting from the edge of the overlap contour C40, as distribution data D110 of the first pattern. For example as shown in FIG. 10B, the distance table TB may include an item (i.e., a row of the distance table TB) corresponding to the line L2 in FIG. 10A, and the item corresponding to the line L2 may include '6' which is the distance from the starting point T1 to the intersection T2 and '10' which is the distance from the starting point T1 to the intersection T3. When the quantity of lines starting from the edge of the overlap contour C40 is 'm', the distance table TB may include 'm' items. In addition, the item of the distance table TB may further include a statistical value of distances. For example, as shown in FIG. 10B, the item of the distance table TB may further include an average value of the distances. The average value of the distances is a value obtained by dividing the sum of the distances by the quantity of first patterns. For example, an item corresponding to the line L2 in the distance table TB of FIG. 10B may include an average value of '5.33'. As described later with reference to FIG. 11, the evaluation contour may be determined by the pattern evaluator 220 based on the distances included in the distance table TB.

FIG. 11 illustrates an operation in which the pattern evaluator 220 determines an evaluation contour based on the data D143 of FIG. 10A and the distance table TB of FIG. 10B.

Referring to FIG. 11, the pattern evaluator 220 may determine an evaluation contour C50 based on the evaluation condition D200 and the distance table TB. For example, as shown in FIG. 11, the evaluation condition D200 may include information indicating an average evaluation, and the pattern evaluator 220 may determine the evaluation contour C50 so that the edge of the evaluation contour C50 is formed at a point distanced from a starting point by '4.6' which is an average value of '0', '2' and '9' corresponding to distances for three points. In this manner, the evaluation contour C50 can be determined such that the edge of the evaluation contour C50 is formed at a point distanced from the starting point by an average value of '4.6', '2' and '9'. In this manner, the pattern evaluator 220 can determine the evaluation contour C50 by making the edges of the evaluation contour C50 be formed at points on a plurality of lines. That is, the pattern evaluator 220 may determine the evaluation contour C50 by calculating the coordinates of the vertices of the evaluation contour C50 based on the evaluation condition D200 and the distance table TB. As another example, when the evaluation condition D200 includes information indicating a worst case, the pattern evaluator 220 may determine the evaluation contour C50 so that the edge of the evaluation contour C50 is formed at an intersection (e.g., the intersection T3 in FIG. 10A) farthest from the starting point, that is, at an intersection indicating the longest distance in each of the items of the distance table TB.

FIGS. 12A and 12B illustrate operations in which the pattern evaluator 220 extracts starting points at the edge of an overlap contour C41.

Referring to FIG. 12A, according to some example embodiments, the pattern evaluator 220 may add at least one starting point between adjacent starting points spaced apart from each other by a first reference interval L1 or more on the edge of the overlap contour C41. As described above, since the first patterns in the input layout data D100 may be respectively represented as polygons, the overlap contour C41 representing an area where the first patterns are all superimposed may also be represented as a polygon. For example, since the pattern evaluator 220 may extract inflection points (i.e., black points in FIG. 12A) on the edge of the overlap contour C41 as starting points and the edge of an evaluation contour is formed at one point on lines starting from the starting points, the edge of the evaluation contour may be relatively inaccurately formed in a portion where the quantity of lines (i.e., the quantity of starting points) is insufficient. Thus, the pattern evaluator 220 may insert one or more starting points (e.g., at equal intervals) between adjacent starting points spaced apart from each other by the first reference interval L1 or more from among the starting points of the overlap contour C41. For example, as shown in FIG. 12A, as one or more starting points (i.e., blank points in FIG. 12A) are inserted between adjacent starting points spaced apart from each other by the first reference interval L1 or more, the pattern evaluator 220 may extract starting points evenly distributed on the edge of an overlap contour C41'.

Referring to FIG. 12B, according to some example embodiments, the pattern evaluator 220 may extract starting points by removing at least one of starting points spaced apart from each other by a second reference interval L2 or less on the edge of an overlap contour C42. For example, as described above with reference to FIG. 10A, lines radiating from the overlap contour C42 may be determined using two starting points adjacent to the starting point. Thus, when inflection points are locally densely on the edge of the overlap contour C42 as a plurality of first patterns are superimposed, the lines radiating from the overlap contour C42 locally generate a plurality of flexures on the edge of an evaluation contour, and thus, the edge of the evaluation contour may be incorrectly formed. Accordingly, as shown in FIG. 12B, the pattern evaluator 220 may remove at least one (i.e., points indicated by 'X' in FIG. 12B) of the starting points spaced apart from each other by the second reference interval L2 or less.

With reference to FIGS. 5 to 8, an operation, in which the distribution estimator 210 and the pattern evaluator 220 of FIG. 3 determine an evaluation contour depending on the evaluation condition D200 by superimposing first patterns of an integrated circuit by using images of the first patterns of the integrated circuit and estimating the distribution of the first patterns, has been described above. In addition, with reference to FIGS. 9 to 12B, an operation, in which the distribution estimator 210 and the pattern evaluator 220 of FIG. 3 determine an evaluation contour depending on the evaluation condition D200 by estimating the distribution of first patterns of an integrated circuit by using lines radiating from an area where the first patterns are all superimposed, has been described above. As described later with reference to FIG. 18, according to some example embodiments, the distribution estimator 210 and the pattern evaluator 220 of FIG. 3 may determine how to superimpose the first patterns, estimate the distribution of the first patterns, and determine an evaluation contour, based on the quantity of first patterns of the input layout data D100. For example, the distribution estimator 210 and the pattern evaluator 220 may perform operations as described above with reference to FIGS. 5 to 8 when the quantity of first patterns is equal to or greater than a reference quantity, and may perform operations as described above with reference to FIGS. 9 to 12B when the quantity of first patterns is less than the reference quantity.

Figure 13:
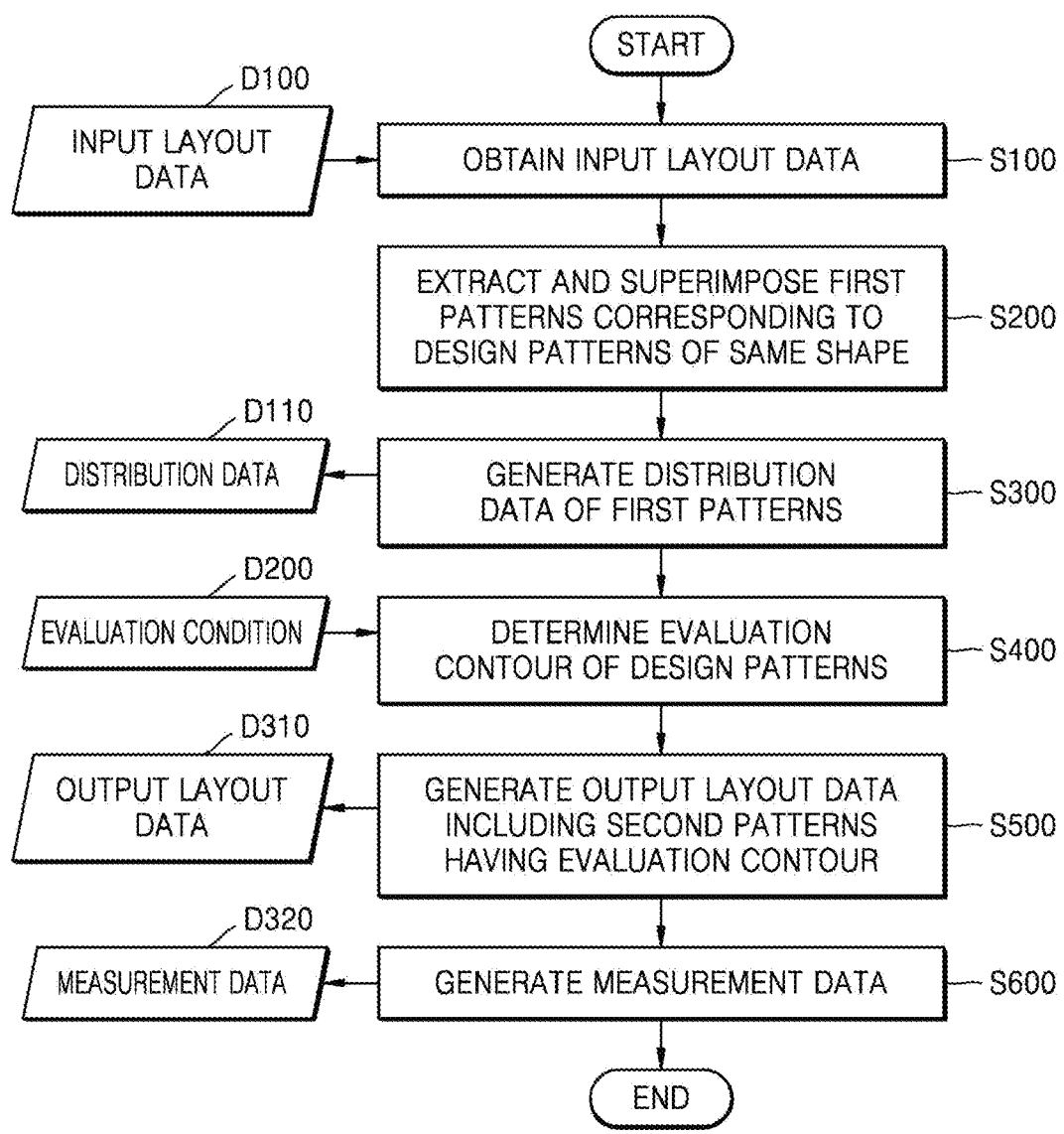
FIG. 13 is a flowchart illustrating a method of evaluating patterns of an integrated circuit, according to some example embodiments.

FIG. 13 is a flowchart illustrating a method of evaluating patterns of an integrated circuit, according to some example embodiments. The method of evaluating patterns of an integrated circuit may be performed as the processor 110 of the computing system 100 of FIG. 1 executes the program 200 of FIG. 3. As shown in FIG. 13, the method may include a plurality of operations S100 to S600.

Referring to FIG. 13, in operation S100, an operation of obtaining input layout data D100 may be performed. As described above, the input layout data D100 may be generated by inspecting an integrated circuit formed in a microfabricated wafer, and may include data (e.g., data D101 and D103 in FIG. 4) representing the shape of first patterns corresponding to design patterns of the same shape and data (e.g., data D102 and D104 in FIG. 4) including the coordinates of the first patterns.

In operation S200, an operation of extracting and superimposing the first patterns corresponding to the design patterns of the same shape, also referred to as design patterns having a common or substantially common shape (e.g., a common shape within manufacturing tolerances and/or material tolerances), may be performed. For example, the distribution estimator 210 may superimpose the first patterns based on the coordinates of the first patterns included in the input layout data D100.

In operation S300, an operation of generating distribution data D110 of the first patterns may be performed. For example, the distribution estimator 210 may generate a pixel matrix including elements corresponding to pixels of a superimposed image, and may generate a distance table including distances of intersections on lines that radiate from an overlap contour.

In operation S400, an operation of determining an evaluation contour of the design patterns may be performed. That is, the evaluation contour of the design patterns corresponding to the first patterns can be determined based on the distribution data D110 of the first patterns and an evaluation condition D200. For example, the pattern evaluator 220 may determine the evaluation contour from the distribution data D110 of the first patterns depending on information defining conditions for evaluating the integrated circuit, included in the evaluation condition D200.

In operation S500, an operation of generating output layout data D310 including second patterns having an evaluation contour may be performed. For example, the pattern evaluator 220 may generate the output layout data D310 by replacing information regarding the first patterns of the input layout data D100 with information regarding the second patterns having the same evaluation contour. The output layout data D310 may include data having a GDSII format as a non-limiting example and may include information on virtual second patterns having an evaluation contour, i.e., a shape determined according to the distribution and evaluation condition of the first patterns.

In operation S600, an operation of generating measurement data D320 may be performed. For example, the pattern evaluator 220 may generate the measurement data D320 by measuring the second pattern based on the information regarding the second patterns included in the output layout data D310. For example, the measurement data D320 may be generated by measuring the width, length, and area of the second patterns. Details of operation S600 will be described later with reference to FIGS. 17A to 18B.

Figure 14:
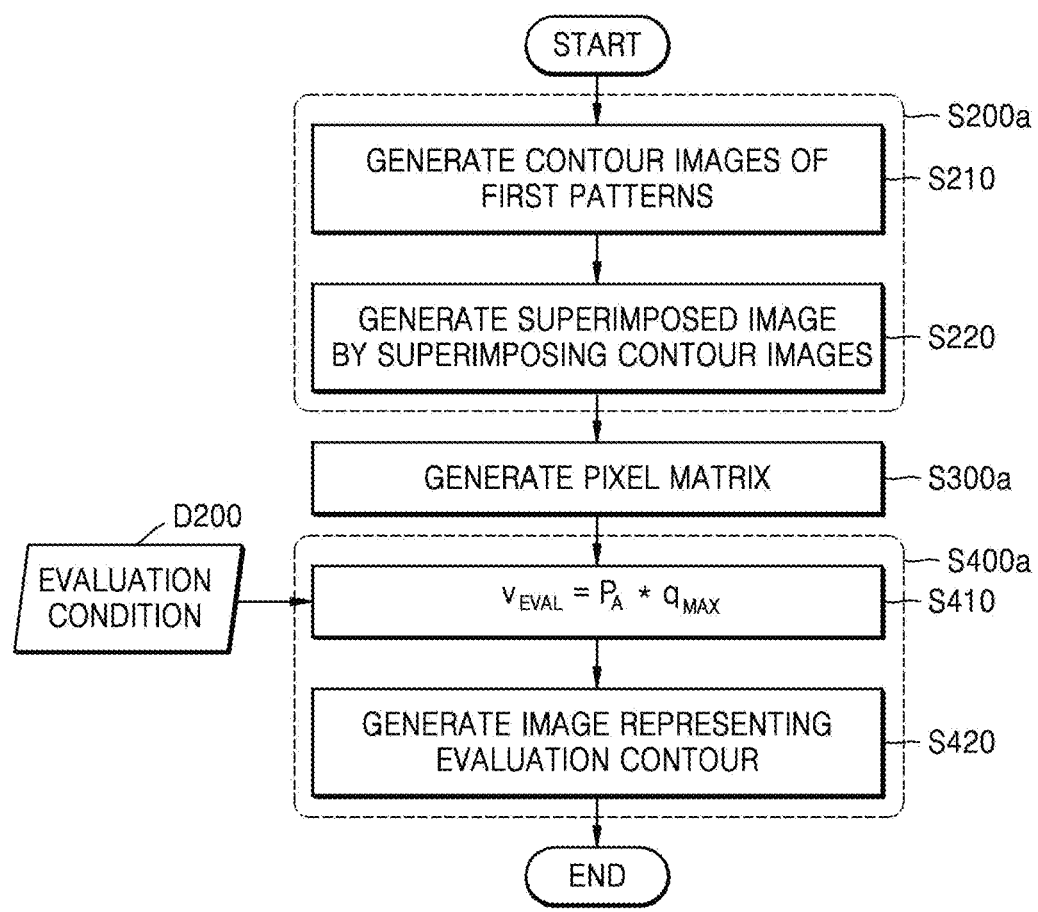
FIG. 14 is a flowchart illustrating an example of operations S200 to S400 of FIG. 13, according to some example embodiments.

FIG. 14 is a flowchart illustrating an example of operations S200 to S400 of FIG. 13, according to some example embodiments. Specifically, the operation of the flowchart shown in FIG. 14 may be similar to the operation performed by the distribution estimator 210 and the pattern evaluator 220 described above with reference to FIGS. 5 to 8. As shown in FIG. 14, operation S200a corresponding to operation S200 of FIG. 13 may include operation S210 and operation S220, and operation S400a corresponding to operation S400 of FIG. 13 may include operation S410 and operation S420.

In operation S210, an operation of generating contour images of the first patterns may be performed. For example, as described above with reference to FIG. 5, the distribution estimator 210 may generate contour images each corresponding to the first patterns, and in each of the contour images, the first pattern may be in a constant position.

In operation S220, an operation of generating a superimposed image by superimposing the contour images may be performed. For example, as described above with reference to FIG. 5, the distribution estimator 210 may generate a superimposed image by superimposing contour images, each corresponding to the first patterns, and the superimposed image may have a shape in which a plurality of contours are superimposed.

In operation S300a, an operation of generating a pixel matrix as distribution data D110 may be performed. For example, as described above with reference to FIG. 6, the distribution estimator 210 may generate a pixel matrix having the quantity of contours, superimposed in a pixel of the superimposed image, as an element. Thus, in the pixel matrix, an element corresponding to a pixel located at the center of the superimposed contours may have the value of the quantity of superimposed contours.

In operation S410, an operation of calculating an evaluation value $V_{EVAL}$ based on the pixel matrix and an evaluation condition D200 may be performed. For example, the pattern evaluator 220 may consider the first patterns to have a normal distribution, and as described above with reference to FIG. 7, the evaluation value $V_{EVAL}$ may denote a minimum value (or lower limit) of an element of the pixel matrix according to probability density determined depending on information included in the evaluation condition D200.

In operation S420, an operation of generating an image representing the evaluation contour may be performed. For example, the pattern evaluator 220 may determine, as an evaluation contour, a set of pixels corresponding to elements having a value equal to or greater than the evaluation value $V_{EVAL}$ in the pixel matrix and may generate an image representing the determined evaluation contour.

Figure 15:
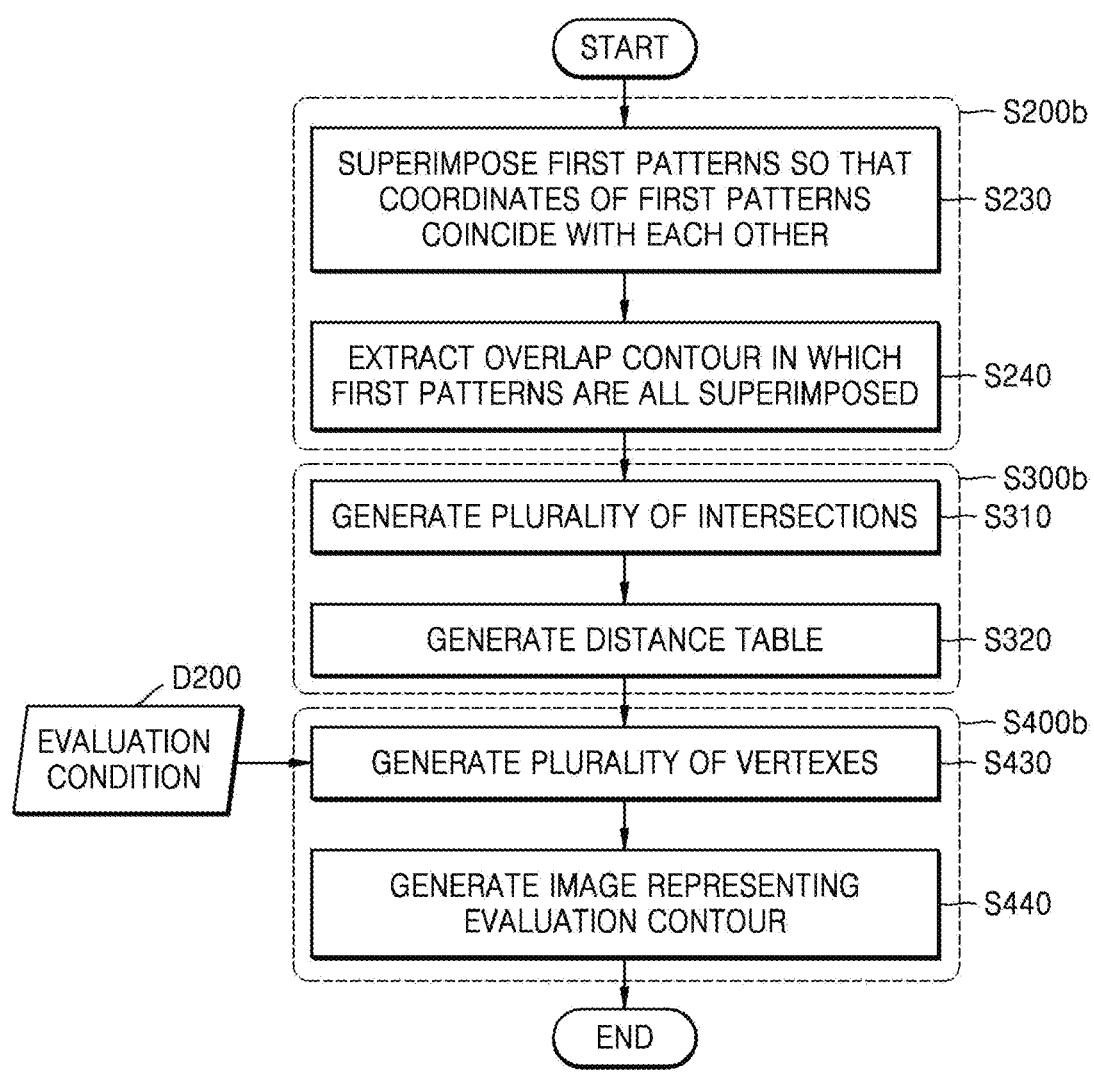
FIG. 15 is a flowchart illustrating an example of operations S200 to S400 of FIG. 13, according to some example embodiments.

FIG. 15 is a flowchart illustrating an example of operations S200 to S400 of FIG. 13 according to some example embodiments. Specifically, the operation of the flowchart shown in FIG. 15 may be similar to the operation performed by the distribution estimator 210 and the pattern evaluator 220 described above with reference to FIGS. 9 to 12B. As shown in FIG. 15, operation S200b corresponding to operation S200 in FIG. 13 may include operation S230 and operation S240, operation S300b corresponding to operation S300 in FIG. 13 may include operation S310 and operation S320, and operation S400b corresponding to operation S400 of FIG. 13 may include operation S430 and operation S440.

In operation S230, an operation of superimposing the first patterns so that the coordinates of the first patterns coincide with each other may be performed. For example, the distribution estimator 210 may superimpose the first patterns so that the coordinates of the first patterns coincide with each other, based on the coordinates of the first patterns included in the input layout data D100. In some example embodiments, data in which the first patterns are superimposed may have a format representing the shape of patterns in the input layout data D100, e.g., a GDSII format.

In operation S240, an operation of extracting an overlap contour in which the first patterns are all superimposed may be performed. For example, as shown in FIG. 9, the distribution estimator 210 may extract an overlap contour C40 from data D141 in which the first patterns are superimposed. In subsequent operations, the overlap contour may be used to determine an evaluation contour.

In operation S310, an operation of generating a plurality of intersections may be performed. For example, as shown in FIG. 10A, the distribution estimator 210 may generate a plurality of lines that radiate from the overlap contour C40, and may generate intersections where the first patterns intersect the plurality of lines, that is, may calculate the coordinates of the intersections. In some example embodiments, a plurality of lines that radiate from the overlap contour C40 may start from inflection points on the edge of the overlap contour C40.

In operation S320, an operation of generating a distance table as distribution data D110 may be performed. For example, as shown in FIG. 10B, the distribution estimator 210 may generate a distance table (TB) including, as items, distances from the edge of the overlap contour to the intersections on the plurality of lines starting from the edge of the overlap contour. In some example embodiments, the item of the distance table TB may further include a statistical value of the distances.

In operation S430, an operation of generating a plurality of vertexes, which form the edge of the evaluation contour, based on the distance table and the evaluation condition D200 may be performed. For example, the pattern evaluator 220 may calculate distances by which the vertexes on the plurality of lines are spaced apart from the edge of the overlap contour, according to information included in the evaluation condition D200, and thus may calculate the coordinates of the vertices.

In operation S440, an operation of generating the evaluation contour from the plurality of vertexes may be performed. That is, the evaluation contour may be generated to have an edge connecting the vertexes.

Figure 16:
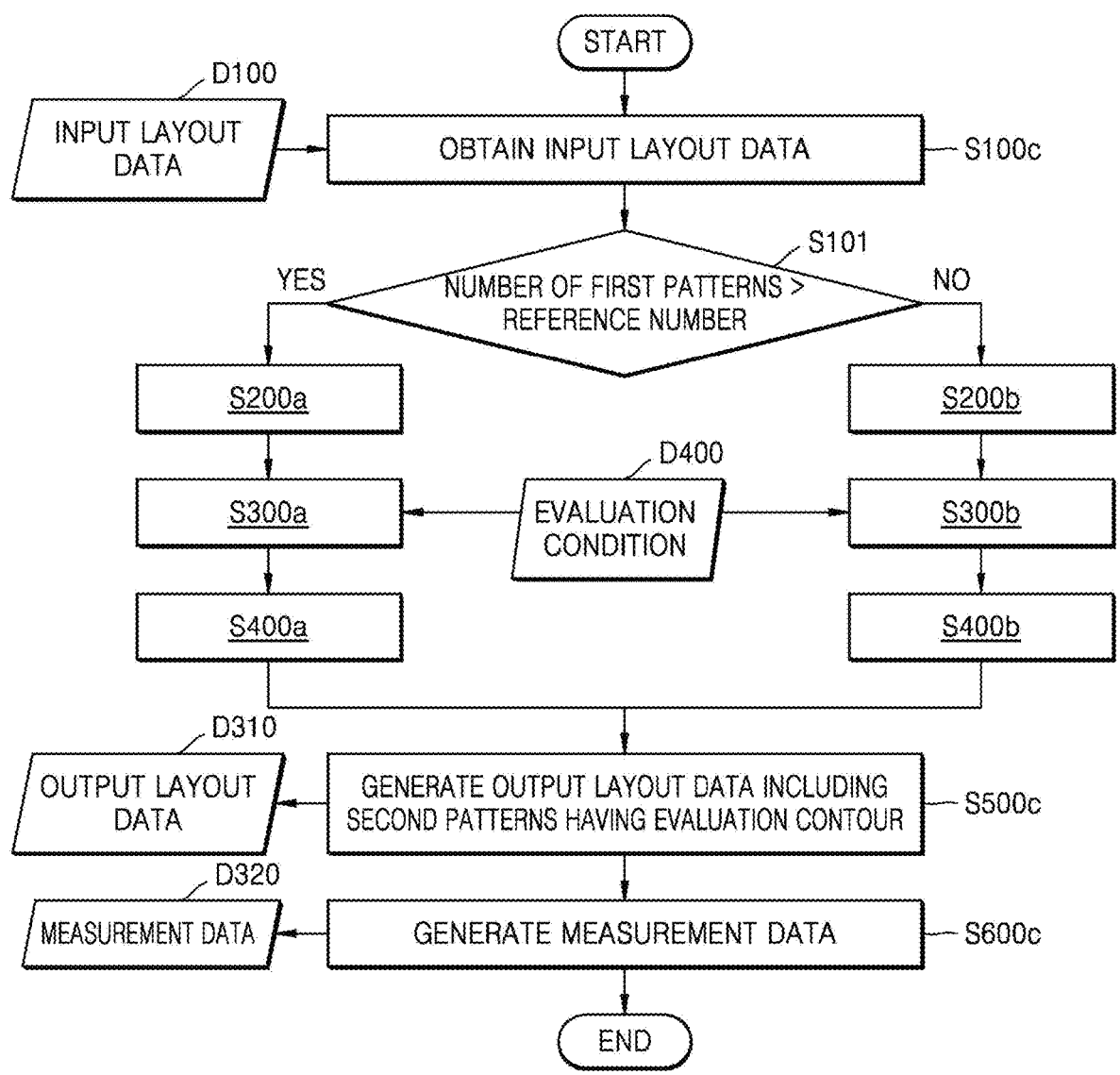
FIG. 16 is a flowchart illustrating a method of evaluating patterns of an integrated circuit, according to some example embodiments.

FIG. 16 is a flowchart illustrating a method of evaluating patterns of an integrated circuit, according to some example embodiments. As shown in FIG. 16, a method of extracting and evaluating the distribution of first patterns based on the quantity of first patterns may be determined. Operations S200a, S300a, and S400a in FIG. 16 may be the same as or similar to operations S200a, S300a, and S400a in FIG. 14, respectively, and operations S200b, S300b, and S400b in FIG. 16 may be the same as or similar to operations S200b, S300b, and S400b in FIG. 15, respectively.

Referring to FIG. 16, after input layout data D100 is obtained in operation S100c, operation S101 may be further performed to compare the quantity of first patterns with a reference quantity, as compared with the embodiment shown in FIG. 13. For example, the operations as shown in FIG. 14 (or the operations described above with reference to FIGS. 5 to 8) may be advantageous in accurately estimating the distribution of the first patterns when the quantity of first patterns is relatively large. On the other hand, the operations as shown in FIG. 15 (or the operations described above with reference to FIGS. 9 to 12B) may be advantageous in estimating the distribution of the first patterns in a case where it is difficult to estimate the distribution of the first patterns due to an insufficient quantity of first patterns. Accordingly, the first patterns may be efficiently and optimally evaluated based on the characteristics of the first patterns formed on a microfabricated wafer or the characteristics of the input layout data D100 according to a manner of inspecting the microfabricated wafer.

In response to a determination that the number ("quantity") of first patterns exceeds a reference quantity, operations S200a, S300a, and S400a may be sequentially performed. That is, in operation S200a, contour images of the first patterns may be generated and the contour images may be superimposed to generate a superimposed image. In operation S300a, a pixel matrix may be generated as distribution data of the first patterns, based on the superimposed image. Then, in operation S400a, an evaluation contour may be determined based on the pixel matrix and an evaluation condition D200. On the other hand, when the quantity of first patterns is equal to or less than the reference quantity, operations S200b, S300b, an S400b may be sequentially performed. That is, in operation S200b, an overlap contour may be extracted by superimposing the first patterns. In operation S300b, a distance table may be generated as distribution data of the first patterns based on intersections where the first patterns intersect a plurality of lines radiating from the overlap contour. Then, in operation S400b, an evaluation contour may be determined based on the distance table and the evaluation condition D200.

In operation S500c, an operation of generating output layout data D310 including second patterns having an evaluation contour, based on the evaluation contour determined in operation S400a or operation S400b, may be performed. Then, in operation S600c, an operation of generating measurement data D320 based on the output layout data D310 may be performed.

Figure 17A:
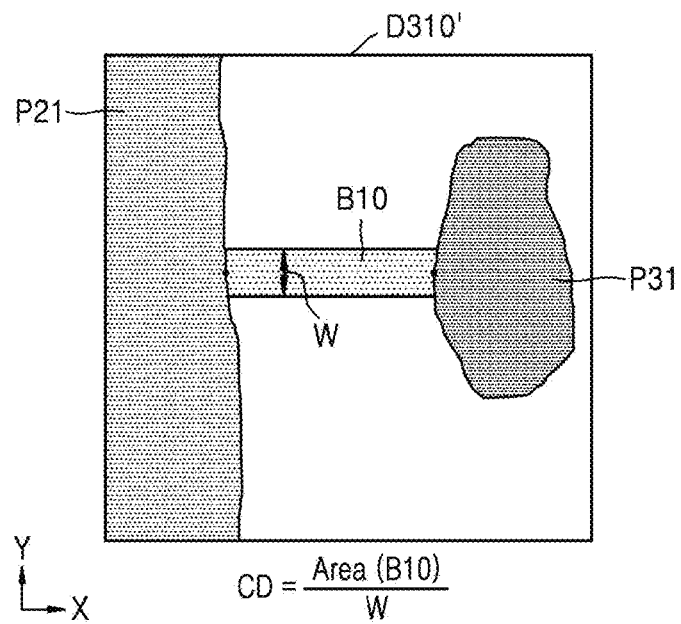
FIG. 17A and FIG. 17B illustrate an operation in which the pattern evaluator of FIG. 3 generates measurement data, according to some example embodiments.
Figure 17B:
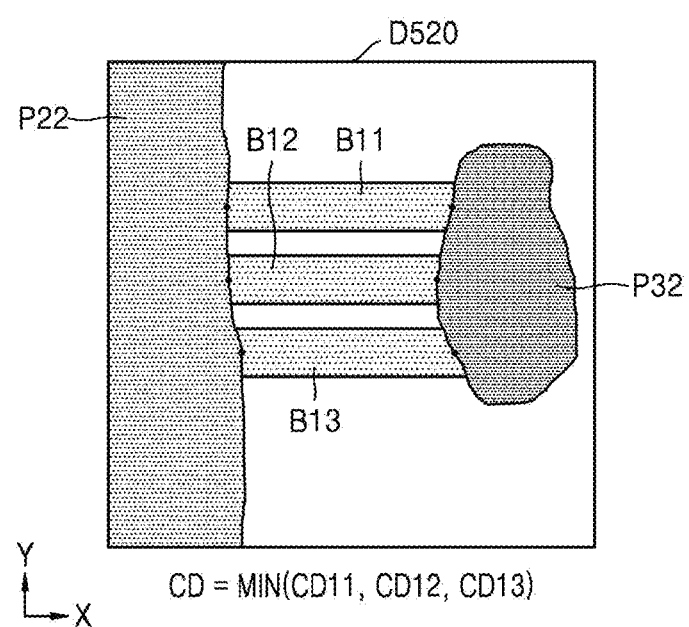

FIGS. 17A and 17B illustrate an operation in which measurement data D320 is generated from output layout data D310, according to some example embodiments. As described above with reference to FIG. 3, the pattern evaluator 220 may generate the measurement data D320 by measuring second patterns in the output layout data D310.

Referring to FIG. 17A, a distance between a second pattern P21 having an evaluation contour and another pattern P31 in output layout data D310' may be measured differently depending a measuring position, that is, the position of a point on the edge of the second pattern P21 and the position of a point on the edge of the other pattern P31, due to the shape of the second pattern P21 and the shape of the other pattern P31. Accordingly, as shown in FIG. 17A, the pattern evaluator 220 may generate a bridge region B10, of the output layout data D310', having a constant width W between the second pattern P21 and the other pattern P31, and may calculate an average distance CD between the second pattern P21 and the other pattern P31 by dividing the area (i.e., Area (B10)) of the bridge region B10 by the width W of the bridge region B10. The width W of the bridge region B10 may be a particular (or alternatively, predetermined) value or may be a value determined by the second pattern P21 and the other pattern P31 to be measured. For example, unlike the embodiment shown in FIG. 17A, the width of the bridge region B10 may coincide with the Y-direction length of the other pattern P31.

The second pattern P21 and the other pattern P31 may be patterns formed in the same layer of an integrated circuit or patterns formed in different layers of the integrated circuit. That is, for example, the second pattern P21 may be a pattern formed in a wiring layer (or metal layer) for a bit line of a semiconductor memory device, and the other pattern P31 may be a contact for electrically connecting patterns formed in different wiring layers. For example, the design rules of an integrated circuit may define spaces between patterns formed in the same layer, spaces between patterns formed in different layers, and so on, and the measurement data D320 generated according to the exemplary embodiment may be used as a basis for determining whether an integrated circuit included in a microfabricated wafer conforms to design rules. Such an integrated circuit may be selectively incorporated into the fabrication of a semiconductor device based on a determination that the integrated circuit conforms to the design rules.

The pattern evaluator 220 may generate measurement data D320 that includes a determined average distance. The pattern evaluator 220 may also generate measurement data D320 that includes coordinate information indicating a position at which the distance between the second pattern P21 and the other pattern P31 is measured or the position of the second pattern P21 or the other pattern P31. Accordingly, the measurement data D320 may include a plurality of distances measured for each of the second patterns in the output layout data D310. In some example embodiments, the measurement data D320 may include a plurality of distances arranged in ascending order, and the measurement data D320 may further include coordinate information indicating a measured position or the position of a measured second pattern, which corresponds to each of the measured distances.

Referring to FIG. 17B, the pattern evaluator 220 may generate a plurality of bridge regions B11, B12, and B13 between a second pattern P22 and another pattern P32 and may calculate average distances CD11, CD12, and CD13 calculated from the plurality of bridge regions B11, B12, and B13. The plurality of bridge regions B11, B12, and B13 may not be superimposed as shown in FIG. 17B, or at least two or more of the plurality of bridge regions may be superimposed, unlike the example shown in FIG. 16.

The pattern evaluator 220 may determine the minimum of the calculated average distances CD11, CD12 and CD13 as the distance between the second pattern P22 and the other pattern P32. The design rules of an integrated circuit may include a space rule between patterns, and the space rule may define a minimum separation distance between patterns. That is, patterns of the integrated circuit may be evaluated by determining whether a minimum separation distance between both patterns exceeds a distance specified in the space rule. Accordingly, the pattern evaluator 220 may provide a basis for determining whether the second pattern P22 and/or the other pattern P32 conforms to the space rule, by determining the minimum of the calculated average distances CD11, CD12 and CD13 as the distance between the second pattern P22 and the other pattern P32. Although three bridge regions B11, B12, and B13 have been generated in the example of FIG. 17B, it will be understood that less than three or more than three bridge regions may be generated according to some example embodiments.

Figure 18A:
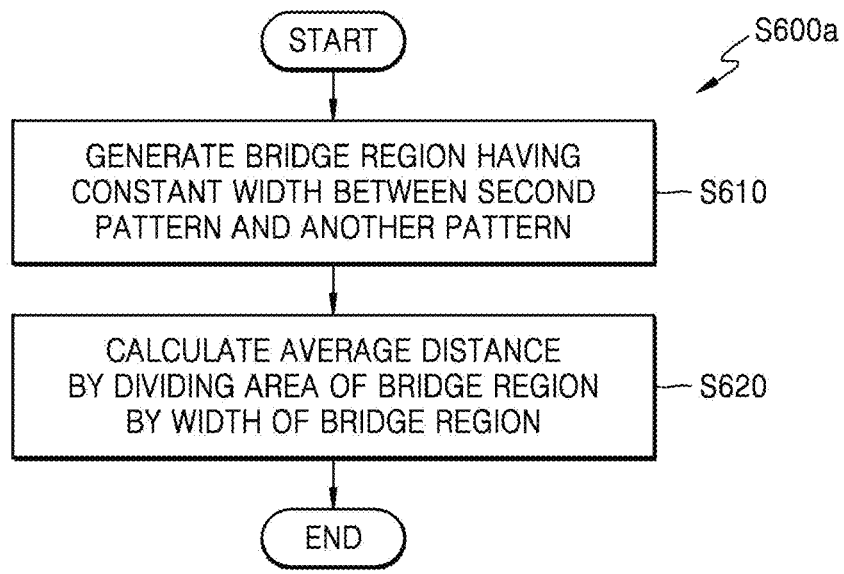
FIG. 18A and FIG. 18B are flowcharts illustrating a method of measuring a second pattern, according to some example embodiments.
Figure 18B:
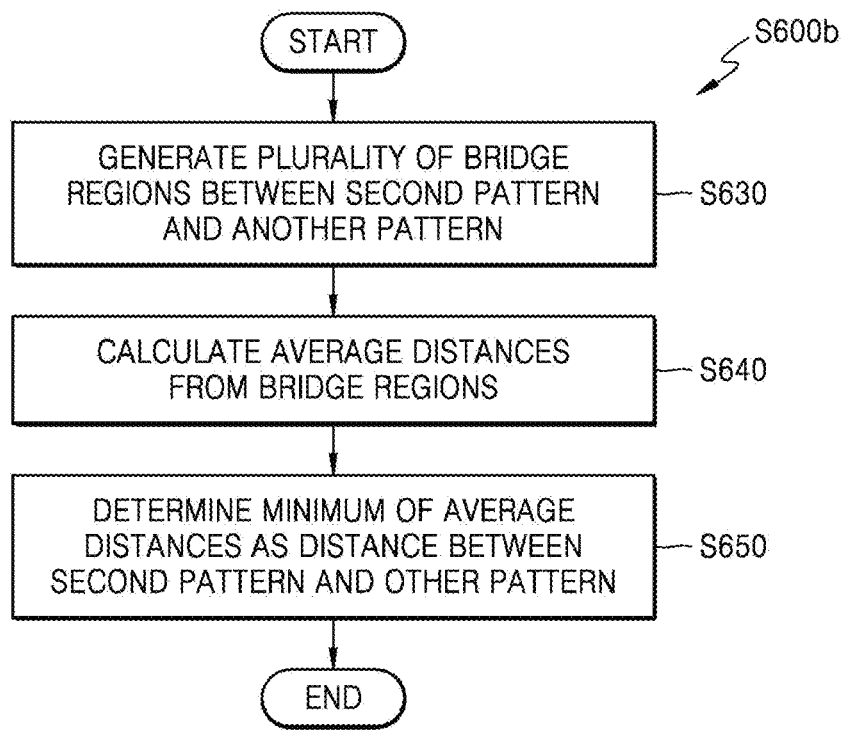

FIGS. 18A and 18B are flowcharts illustrating a method of measuring a second pattern, according to some example embodiments. Operations S600a and S600b of generating measurement data D320, shown in FIGS. 18A and 18B, can be examples of operation S600 in FIG. 13 and may be performed by the pattern evaluator 220 in FIG. 3. Hereinafter, FIGS. 18A and 18B will be described with reference to FIGS. 17A and 17B.

Referring to FIG. 18A, in operation S610, an operation of generating a bridge region having a constant width between a second pattern and another pattern may be performed. For example, as shown in FIG. 17A, the pattern evaluator 220 may generate the bridge region B10 between the second pattern P21 having an evaluation contour and the other pattern P31. The bridge region B10 is virtually generated to measure the distance between the second pattern P21 and the other pattern P31, and the width W of the bridge region B10 may be predefined or may be determined based on the second pattern P21 and the other pattern P31 (e.g., along a short one of the lengths of both patterns in a direction parallel to the width of the bridge region).

In operation S620, an operation of calculating an average distance by dividing the area of the bridge region by the width of the bridge region may be performed. For example, as shown in FIG. 17A, the pattern evaluator 220 may calculate the average distance CD by dividing the area of the bridge region B10 by the width W of the bridge region B10. As described above with reference to FIG. 17A, the distance between the second pattern P21 and the other pattern P31 may be measured differently depending on the measurement position, due to the shapes of the second pattern P21 and the other pattern P31. In addition, since the second pattern P21 has an evaluation contour determined based on the distribution of first patterns, a distance measured at a particular position may differ from that in an integrated circuit of an actual microfabricated wafer. The pattern evaluator 220 may measure the distance between the second pattern P21 and the other pattern P31 by defining the bridge region B10 and calculating the average distance CD by using the area and width W of the bridge region B10, and thus, the second pattern P21 and/or the other pattern P31 may be efficiently evaluated.

Referring to FIG. 18B, in operation S630, a plurality of bridge regions may be generated between the second pattern and the other pattern. For example, as shown in FIG. 17B, the pattern evaluator 220 may generate three bridge regions B11, B12, and B13 between the second pattern P22 and the other pattern P32. The plurality of bridge regions may not be superimposed, or two or more bridge regions may be superimposed.

In operation S640, an operation of calculating average distances from the bridge regions may be performed. For example, as shown in FIG. 17B, the pattern evaluator 220 may calculate three average distances CD11, CD12, and CD13 from the three bridge regions B11, B12, and B13. Due to the shapes of the second pattern P22 and the other pattern P32, the three average distances CD11, CD12, and CD13 may have the same value or different values.

In operation S650, an operation of determining the minimum of the average distances as the distance between the second pattern P22 and the other pattern P32 may be performed. For example, as shown in FIG. 17B, the minimum of the three average distances CD11, CD12, and CD13 may be determined as the distance between the second pattern P22 and the other pattern P32. As described above, since a separation distance between patterns may have a lower limit, the minimum of calculated average distances may be determined as a distance between both patterns.

Figure 19:
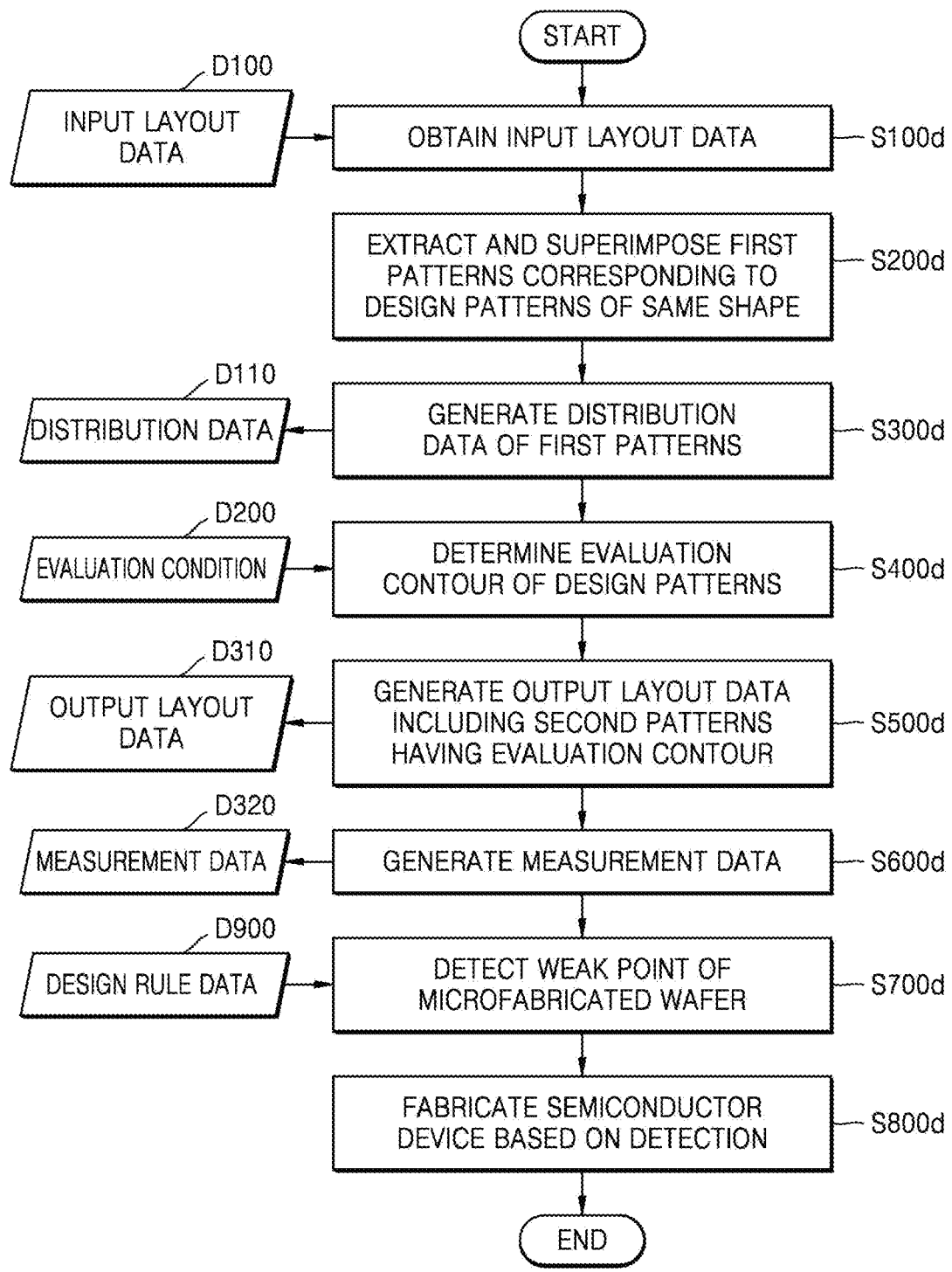
FIG. 19 is a flowchart illustrating a method of evaluating patterns of an integrated circuit, according to some example embodiments.

FIG. 19 is a flowchart illustrating a method of evaluating patterns of an integrated circuit, according to some example embodiments. As shown in FIG. 19, the method of evaluating patterns of an integrated circuit may include a plurality of operations S100d to S700d. Operations S100d to S600d in FIG. 19 may be the same as or similar to operations S100 to S600 in FIG. 13, and descriptions of operations S100d to S600d are omitted below.

Referring to FIG. 19, the method of evaluating patterns of an integrated circuit may further include an operation (operation S700d) of detecting a weak point of a microfabricated wafer based on measurement data D320 and design rule data D400, as compared with the example of FIG. 13. That is, the design rule data D400 may be provided to the pattern evaluator 220 of FIG. 3, and the pattern evaluator 220 may detect the weak point based on the measurement data D320 and the design rule data D400.

As described above, design rules may include a space rule between patterns, and based on distance information included in the measurement data D320, it may be determined whether or not first patterns of the integrated circuit conform to the space rule. That is, whether or not the first patterns of the integrated circuit conform to the space rule may be determined by determining whether or not second patterns having an evaluation contour determined based on the distribution of the first patterns conform to the space rule. For example, the position of the second pattern in which a distance shorter than that defined by the space rule is measured may be extracted, and such a second pattern may be detected as a weak point. Information about detected weak points may be provided to a user via an output device (e.g., a display device, a printer, etc.) included in the input/output devices 120 of FIG. 1 and may be stored as data in the storage device 160 of FIG. 1.

Still referring to FIG. 19, a semiconductor device may be fabricated, in operation S800d, based on the detection at operation S700d. The fabrication may include excluding an inspected integrated circuit from the fabrication based on the detected weak point(s). In some example embodiments, the inspected integrated circuit may be selectively incorporated into the fabrication of a semiconductor device based on a determination that the inspected integrated circuit conforms to the design rules as indicated in the design rule data D400. In some example embodiments, the inspected integrated circuit may be selectively incorporated into the fabrication of a semiconductor device based on a determination, at operation S700d, that the quantity and/or concentration of weak points detected at S700d are less than one or more corresponding threshold values. As a result, the fabricated semiconductor device may have a reduced and/or eliminated presence of weak points in an incorporated integrated circuit. Thus, the performance, reliability, and/or lifetime of the semiconductor device, and any electronic device that may include the semiconductor device, may be improved.

In some example embodiments, as described herein, semiconductor device includes an electronic device having a similar structure as the computing system 100 shown in FIG.

1. For example, the semiconductor device may be a computing system 100. An integrated circuit may be incorporated into one or more of the elements of such a semiconductor device hat is a computing system 100. For example, an integrated circuit may be incorporated into at least one of the processor 110, RAM 140, ROM 150, storage device 160, network interface 130, and/or I/O devices 120.

While the inventive concepts have been particularly shown and described with reference to embodiments thereof, it will be understood that various changes in form and details may be made therein without departing from the spirit and scope of the following claims.

What is claimed is:

1. A method, performed by a computing system, of evaluating patterns of an integrated circuit, the method comprising:
    obtaining input layout data generated based on inspecting the integrated circuit;
    extracting and superimposing first patterns corresponding to design patterns having a common shape from the input layout data;
    generating distribution data of the first patterns based on the superimposed first patterns;
    determining an evaluation contour of the design patterns based on an evaluation condition and the distribution data;
    generating output layout data based on replacing the first patterns with second patterns each having the evaluation contour; and
    generating measurement data based on measuring at least one of the second patterns from the output layout data.

2. The method of claim 1, further comprising:
    obtaining coordinate data including coordinates of the first patterns;
    wherein the extracting and superimposing the first patterns includes
       generating contour images representing contours of the first patterns from the input layout data, based on the coordinates of the first patterns, and
       generating a superimposed image based on superimposing the contour images.

3. The method of claim 2, wherein the generating the contour images and the generating the superimposed image are performed in response to a determination that a quantity of first patterns is equal to or greater than a reference value.

4. The method of claim 1, further comprising:
    obtaining coordinate data including coordinates of the first patterns;
    wherein the extracting and superimposing the first patterns includes
       superimposing the first patterns so that the coordinates of the first patterns coincide with each other, and
       extracting an overlap contour in which the first patterns are all superimposed.

5. The method of claim 4, wherein the extracting the overlap contour is performed when a quantity of first patterns is equal to or less than a reference value.

6. The method of claim 1, further comprising:
    detecting a weak point of the integrated circuit based on design rule data of the integrated circuit and the measurement data.

7. A method, comprising:
    obtaining input layout data generated based on inspecting an integrated circuit;
    extracting and superimposing first patterns corresponding to design patterns having a common shape from the input layout data;
    generating distribution data of the first patterns based on the superimposed first patterns;
    determining an evaluation contour of the design patterns based on an evaluation condition and the distribution data;
    generating output layout data based on replacing the first patterns with second patterns each having the evaluation contour;
    determining whether the inspected integrated circuit includes at least a threshold quantity and/or threshold concentration of weak points based on measuring at least one of the second patterns from the output layout data; and
    selectively incorporating the inspected integrated circuit into a semiconductor device based on a determination that the inspected integrated circuit includes less than the threshold quantity and/or the threshold concentration of weak points.

8. The method of claim 7, further comprising:
    obtaining coordinate data including coordinates of the first patterns;
    wherein the extracting and superimposing the first patterns includes
       generating contour images representing contours of the first patterns from the input layout data, based on the coordinates of the first patterns, and
       generating a superimposed image based on superimposing the contour images.

9. The method of claim 8, wherein the generating the contour images and the generating the superimposed image are performed in response to a determination that a quantity of first patterns is equal to or greater than a reference value.

10. The method of claim 7, further comprising:
    obtaining coordinate data including coordinates of the first patterns;
    wherein the extracting and superimposing the first patterns includes
       superimposing the first patterns so that the coordinates of the first patterns coincide with each other, and
       extracting an overlap contour in which the first patterns are all superimposed.

11. The method of claim 10, wherein the extracting the overlap contour is performed when a quantity of first patterns is equal to or less than a reference value.

12. The method of claim 7, further comprising:
    determining whether the inspected integrated circuit includes at least the threshold quantity and/or threshold concentration of weak points based on design rule data of the integrated circuit.

13. A method, comprising:
    obtaining input layout data generated based on inspecting an integrated circuit;
    extracting and superimposing first patterns corresponding to design patterns having a common shape from the input layout data;
    determining an evaluation contour of the design patterns based on an evaluation condition and the superimposed first patterns;
    determining whether the inspected integrated circuit includes at least a threshold quantity and/or threshold concentration of weak points based on replacing the first patterns with second patterns each having the evaluation contour and measuring at least one of the second patterns; and
    selectively incorporating the inspected integrated circuit into a semiconductor device based on a determination that the inspected integrated circuit includes less than the threshold quantity and/or the threshold concentration of weak points.

14. The method of claim 13, further comprising:
obtaining coordinate data including coordinates of the first patterns;
wherein the extracting and superimposing the first patterns includes
generating contour images representing contours of the first patterns from the input layout data, based on the coordinates of the first patterns, and
generating a superimposed image based on superimposing the contour images.

15. The method of claim 14, wherein the generating the contour images and the generating the superimposed image are performed in response to a determination that a quantity of first patterns is equal to or greater than a reference value.

16. The method of claim 13, further comprising:
obtaining coordinate data including coordinates of the first patterns;
wherein the extracting and superimposing the first patterns includes
superimposing the first patterns so that the coordinates of the first patterns coincide with each other, and
extracting an overlap contour in which the first patterns are all superimposed.

17. The method of claim 16, wherein the extracting the overlap contour is performed when a quantity of first patterns is equal to or less than a reference value.

* * * * *